(12) United States Patent  (10) Patent No.: US 7,687,740 B2
Bruland et al.  (45) Date of Patent: *Mar. 30, 2010

(54) SEMICONDUCTOR STRUCTURE PROCESSING USING MULTIPLE LATERALLY SPACED LASER BEAM SPOTS DELIVERING MULTIPLE BLOWS

(75) Inventors: Kelly J. Bruland, Portland, OR (US); Brian W. Baird, Oregon City, OR (US); Ho Wai Lo, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/051,262

(22) Filed: Feb. 4, 2005

(65) Prior Publication Data

US 2005/0282406 A1    Dec. 22, 2005

Related U.S. Application Data

(60) Provisional application No. 60/580,917, filed on Jun. 18, 2004.

(51) Int. Cl.
*B23K 26/00* (2006.01)

(52) U.S. Cl. .............................. 219/121.69; 219/121.68; 219/121.67

(58) Field of Classification Search ............ 219/121.69, 219/121.68, 121.67, 121.85; 438/128, 795, 438/530, 166; 365/200
See application file for complete search history.

(56) References Cited

U.S. PATENT DOCUMENTS 4,083,629 A    4/1978   Kocher et al.

(Continued)

FOREIGN PATENT DOCUMENTS

DE    10234943    2/2004

(Continued)

OTHER PUBLICATIONS

Office action in U.S. Appl. No. 11/051,263, Oct. 18, 2007.

(Continued)

*Primary Examiner*—M. Alexandra Elve
(74) *Attorney, Agent, or Firm*—Stoel Rives LLP

(57) ABSTRACT

Methods and systems process a semiconductor substrate having a plurality of structures to be selectively irradiated with multiple laser beams. The structures are arranged in a plurality of substantially parallel rows extending in a generally lengthwise direction. The method generates a first laser beam that propagates along a first laser beam axis that intersects a first target location on or within the semiconductor substrate. The method also generates a second laser beam that propagates along a second laser beam axis that intersects a second target location on or within the semiconductor substrate. The second target location is offset from the first target location in a direction perpendicular to the lengthwise direction of the rows by some amount such that, when the first target location is a structure on a first row of structures, the second target location is a structure or between two adjacent structures on a second row distinct from the first row. The method moves the semiconductor substrate relative to the first and second laser axes in a direction approximately parallel to the rows of structures, so as to pass the first target location along the first row to irradiate for a first time selected structures in the first row, and so as to simultaneously pass the second target location along the second row to irradiate for a second time structures previously irradiated by the first laser beam during a previous pass of the first target location along the second row.

32 Claims, 15 Drawing Sheets

U.S. PATENT DOCUMENTS

| | | | |
|---|---|---|---|
| 4,311,360 A | 1/1982 | Hodson et al. | |
| 4,532,402 A | 7/1985 | Overbeck | |
| 4,564,739 A | 1/1986 | Mattelin | |
| 4,701,591 A | 10/1987 | Masaki et al. | |
| 4,727,381 A | 2/1988 | Bille et al. | |
| 4,982,166 A | 1/1991 | Morrow | |
| 5,295,014 A | 3/1994 | Toda | |
| 5,300,756 A | 4/1994 | Cordingley | |
| 5,430,816 A | 7/1995 | Furuya et al. | |
| 5,473,409 A * | 12/1995 | Takeda et al. | 355/53 |
| 5,481,407 A | 1/1996 | Smith et al. | |
| 5,629,790 A | 5/1997 | Neukermans et al. | |
| 5,751,585 A | 5/1998 | Cutler et al. | |
| 5,837,962 A | 11/1998 | Overbeck | |
| 5,847,960 A | 12/1998 | Cutler et al. | |
| 5,933,218 A | 8/1999 | Matsubara et al. | |
| 5,998,759 A | 12/1999 | Smart | |
| 6,313,433 B1 | 11/2001 | Sukman et al. | |
| 6,324,195 B1 | 11/2001 | Suzuki et al. | |
| 6,368,945 B1 | 4/2002 | Im | |
| 6,385,228 B1 | 5/2002 | Dane et al. | |
| 6,407,363 B2 | 6/2002 | Dunsky et al. | |
| 6,416,190 B1 | 7/2002 | Grier et al. | |
| 6,423,925 B1 | 7/2002 | Sukhman et al. | |
| 6,433,301 B1 | 8/2002 | Dunsky et al. | |
| 6,462,306 B1 | 10/2002 | Kitai et al. | |
| 6,479,788 B1 | 11/2002 | Arai et al. | |
| 6,521,866 B1 | 2/2003 | Arai et al. | |
| 6,541,731 B2 | 4/2003 | Mead et al. | |
| 6,563,082 B2 | 5/2003 | Terada et al. | |
| 6,567,219 B1 | 5/2003 | Tanaka | |
| 6,574,250 B2 | 6/2003 | Sun et al. | |
| 6,580,055 B2 | 6/2003 | Iso | |
| 6,593,542 B2 | 7/2003 | Baird et al. | |
| 6,816,294 B2 | 11/2004 | Unrath et al. | |
| 6,841,482 B2 | 1/2005 | Boyle | |
| 6,849,824 B2 | 2/2005 | Arai et al. | |
| 6,875,951 B2 * | 4/2005 | Sakamoto et al. | 219/121.73 |
| 6,884,668 B2 * | 4/2005 | Yamazaki et al. | 438/166 |
| 6,902,990 B2 | 6/2005 | Gottfried et al. | |
| 6,909,735 B2 * | 6/2005 | Lizotte et al. | 372/109 |
| 6,951,995 B2 * | 10/2005 | Couch et al. | 219/121.67 |
| 6,972,268 B2 * | 12/2005 | Ehrmann et al. | 438/795 |
| 6,984,802 B2 | 1/2006 | Kuroiwa et al. | |
| 7,394,476 B2 | 7/2008 | Cordingley et al. | |
| 2002/0000426 A1 | 1/2002 | Mead et al. | |
| 2002/0040893 A1 | 4/2002 | Arai et al. | |
| 2002/0050488 A1 * | 5/2002 | Nikitin et al. | 219/121.64 |
| 2002/0060210 A1 | 5/2002 | Terada et al. | |
| 2002/0162973 A1 | 11/2002 | Cordingley et al. | |
| 2002/0167581 A1 * | 11/2002 | Cordingley et al. | 347/173 |
| 2002/0170898 A1 | 11/2002 | Ehrmann et al. | |
| 2004/0173590 A1 | 9/2004 | Hata et al. | |
| 2005/0168715 A1 | 8/2005 | Kemper et al. | |
| 2005/0279736 A1 | 12/2005 | Bruland et al. | |
| 2005/0279739 A1 | 12/2005 | Bruland et al. | |
| 2005/0281101 A1 | 12/2005 | Bruland et al. | |
| 2005/0281102 A1 | 12/2005 | Bruland | |
| 2005/0282319 A1 | 12/2005 | Bruland et al. | |
| 2005/0282367 A1 | 12/2005 | Bruland et al. | |
| 2005/0282407 A1 | 12/2005 | Bruland et al. | |
| 2006/0205121 A1 | 9/2006 | Couch et al. | |
| 2007/0215820 A1 | 9/2007 | Cordingley et al. | |
| 2008/0094640 A1 | 4/2008 | Cordingley et al. | |
| 2008/0284837 A1 | 11/2008 | Cordingley et al. | |

FOREIGN PATENT DOCUMENTS

| | | |
|---|---|---|
| GB | 2 331 038 | 5/1999 |
| JP | 55-081095 | 6/1980 |
| JP | 56-143434 | 11/1981 |
| JP | 62-086839 | 4/1987 |
| JP | 63-005891 | 1/1988 |
| JP | 63-136545 | 6/1988 |
| JP | 63-264286 | 11/1988 |
| JP | 63-302503 | 12/1988 |
| JP | 64-044295 | 2/1989 |
| JP | 01-289586 | 11/1989 |
| JP | 02-063103 | 3/1990 |
| JP | 02-089586 | 3/1990 |
| JP | 2-089586 | 3/1990 |
| JP | 2-137682 | 5/1990 |
| JP | 02-137682 | 5/1990 |
| JP | 3-297588 | 12/1991 |
| JP | 04-098801 | 3/1992 |
| JP | 10328873 A | 12/1998 |
| JP | 11-19786 | 1/1999 |
| JP | 11-104863 | 4/1999 |
| JP | 11-104871 | 4/1999 |
| JP | 11149317 A | 6/1999 |
| JP | 11-245060 | 9/1999 |
| JP | 11245073 A | 9/1999 |
| JP | 2000-190087 | 7/2000 |
| JP | 2001-021931 | 1/2001 |
| JP | 2001-121279 | 5/2001 |
| JP | 2001-170788 | 6/2001 |
| JP | 2001-269790 | 10/2001 |
| JP | 2002-011588 | 1/2002 |
| JP | 2002-361464 | 12/2002 |
| JP | 2003-053561 | 2/2003 |
| JP | 2003-053575 | 2/2003 |
| JP | 2003-053576 | 2/2003 |
| JP | 2003334684 A | 11/2003 |
| JP | 2004-306101 | 11/2004 |
| JP | 2005-177788 | 7/2005 |
| WO | WO2004/015747 A1 | 2/2004 |

OTHER PUBLICATIONS

Response to Office action in U.S. Appl. No. 11/051,265, Jan. 3, 2008.
Response to Office action and Terminal Disclaimer in U.S. Appl. No. 11/051,261, Jan. 11, 2008.
Office action in U.S. Appl. No. 11/107,890, Jan. 11, 2008.
Appeal Brief in U.S. Appl. No. 10/818,920, Feb. 29, 2008.
Response to Office action in U.S. Appl. No. 11/247,541, Mar. 5, 2008.
Kastelik et al., "High Dynamic Range, Bifrequency TeO2 Acousto-Optic Modulator," 7 Pure Appl. Opt. (1998), pp. 467-474.
Office action in U.S. Appl. No. 11/051,500, Nov. 29, 2007.
Office action in U.S. Appl. No. 10/818,920, Dec. 6, 2007.
International Search Report, PCT/US05/21406, completed Aug. 7, 2006; mailed Oct. 12, 2006.
Office action in U.S. Appl. No. 10/107,890, mailed Sep. 27, 2007.
Office action in U.S. Appl. No. 11/051,265, mailed Oct. 3, 2007.
First Office Action, U.S. Appl. No. 11/051,263, Oct. 17, 2006.
Second Office Action, U.S. Appl. No. 11/051,263, Apr. 25, 2007.
First Office Action, U.S. Appl. No. 11/051,958, Apr. 4, 2007.
Restriction Requirement, U.S. Appl. No. 11/051,261, Apr. 5, 2007.
Second Office Action, U.S. Appl. No. 11/051,261, Jul. 12 2007.
PTO Filing, U.S. Appl. No. 10/107,890, Dec. 15, 2006.
PTO Filing, U.S. Appl. No. 10/107,890, Mar. 2, 2007.
PTO Filing, U.S. Appl. No. 10/107,890, Jun. 27, 2007.
PTO Filing, U.S. Appl. No. 11/247,541, Dec. 21, 2006.
PTO Filing, U.S. Appl. No. 11/247,541, May 18, 2007.
Office Action, U.S. Appl. No. 11/247,541, Sep. 11, 2007.
Office action in U.S. Appl. No. 11/051,261, May 28, 2008.
Office action in U.S. Appl. No. 11/052,000, Jun. 4, 2008.
Office action in U.S. Appl. No. 11/247,541, Jun. 12, 2008.
Office action in U.S. Appl. No. 11/051,500, Jun. 16, 2008.
Response to Office action in U.S. Appl. No. 10/107,890, Jun. 27, 2008.
Response to Office action in U.S. Appl. No. 11/051,262, Oct. 15, 2008.

Response to Office action in U.S. Appl. No. 11/052,000, Oct. 15, 2008.
Response to Office action in U.S. Appl. No. 11/051,263, Apr. 16, 2008.
Third Office action in U.S. Appl. No. 11/051,261, May 1, 2008.
Response to Office action in U.S. Appl. No. 11/051,261, May 9, 2008.
Office Action, U.S. Appl. No. 10/107,890, Oct. 22, 2008.
Response to Office Action, U.S. Appl. No. 10/107,890, Mar. 20, 2009.
Request for Continued Examination, U.S. Appl. No. 11/247,541, Dec. 12, 2008.
Office Action, U.S. Appl. No. 11/247,541, Mar. 19, 2009.
Office Action, U.S. Appl. No. 11/643,023, May 6, 2009.
Office Action, U.S. Appl. No. 11/643,746, May 13, 2009.
Office Action, U.S. Appl. No. 11/051,261, Feb. 6, 2009.
Office Action, U.S. Appl. No. 11/052,000, Jan. 15, 2009.
Response to Office Action, U.S. Appl. No. 11/052,000, Apr. 15, 2009.
Response to Office Action, U.S. Appl. No. 11/051,500, Apr. 17, 2009.
Office Action, U.S. Appl. No. 11/051,500, Jan. 22, 2009.
Notice of Allowance, U.S. Appl. No. 11/051,263, May 13, 2009.
U.S. Appl. No. 11/051,500, Office Action, Jul. 1, 2009.
U.S. Appl. No. 11/051,500, Response to Office Action, Jul. 10, 2009.
U.S. Appl. No. 11/051,263, Request for Continued Examination, Jul. 1, 2009.
U.S. Appl. No. 11/051,261, Response to Office Action, with Declaration of Inventor, Jul. 2, 2009.

* cited by examiner

Link Run or Spot Travel Direction

Two Spot

Link Run Direction

Three Spot

Link Run Direction

Simultaneous On-Axis and Cross-Axis Configurations

US 7,687,740 B2

SEMICONDUCTOR STRUCTURE PROCESSING USING MULTIPLE LATERALLY SPACED LASER BEAM SPOTS DELIVERING MULTIPLE BLOWS

RELATED APPLICATIONS

This application claims priority under 35 U.S.C. §119 to U.S. Provisional Application No. 60/580,917, entitled "Multiple-Beam Semiconductor Link Processing," filed Jun. 18, 2004, which is incorporated by reference herein in its entirety. Also incorporated by reference herein are the following commonly owned U.S. patent applications filed contemporaneously with this application:

Application Ser. No. 11/051,265, entitled "Semiconductor Structure Processing Using Multiple Laterally Spaced Laser Beam Spots with On-Axis Offset";

Application Ser. No. 11/052,014, entitled "Semiconductor Structure Processing Using Multiple Laterally Spaced Laser Beam Spots with Joint Velocity Profiling";

Application Ser. No. 11/051,500, entitled "Semiconductor Structure Processing Using Multiple Laser Beam Spots Spaced On-Axis Delivered Simultaneously";

Application Ser. No. 11/052,000, entitled "Semiconductor Structure Processing Using Multiple Laser Beam Spots Spaced On-Axis to Increase Single-Blow Throughput";

Application Ser. No. 11/051,262, entitled "Semiconductor Structure Processing Using Multiple Laterally Spaced Laser Beam Spots Delivering Multiple Blows";

Application Ser. No. 11/051,263, entitled "Semiconductor Structure Processing Using Multiple Laser Beam Spots Spaced On-Axis on Non-Adjacent Structures"; and Application Ser. No. 11/051,261, entitled "Semiconductor Structure Processing Using Multiple Laser Beam Spots Overlapping Lengthwise on a Structure."

TECHNICAL FIELD

This disclosure relates generally to manufacturing semiconductor integrated circuits and more particularly to the use of laser beams to process structures on or within a semiconductor integrated circuit.

BACKGROUND

During their fabrication process, ICs (integrated circuits) often incur defects for various reasons. For that reason, IC devices are usually designed to contain redundant circuit elements, such as spare rows and columns of memory cells in semiconductor memory devices, e.g., a DRAM (dynamic random access memory), an SRAM (static random access memory), or an embedded memory. Such devices are also designed to include particular laser-severable links between electrical contacts of the redundant circuit elements. Such links can be removed, for example, to disconnect a defective memory cell and to substitute a replacement redundant cell. Similar techniques are also used to sever links in order to program or configure logic products, such as gate arrays or ASICs (application-specific integrated circuits). After an IC has been fabricated, its circuit elements are tested for defects, and the locations of defects may be recorded in a database. Combined with positional information regarding the layout of the IC and the location of its circuit elements, a laser-based link processing system can be employed to remove selected links so as to make the IC useful.

Laser-severable links are typically about 0.5-1 microns (μm) thick, about 0.5-1 μm wide, and about 8 μm in length. Circuit element in an IC, and thus links between those elements, are typically arranged in a regular geometric arrangement, such as in regular rows. In a typical row of links, the center-to-center pitch between adjacent links is about 2-3 μm. These dimensions are representative, and are declining as technological advances allow for the fabrication of workpieces with smaller features and the creation of laser processing systems with greater accuracy and smaller focused laser beam spots. Although the most prevalent link materials have been polysilicon and like compositions, memory manufacturers have more recently adopted a variety of more conductive metallic link materials that may include, but are not limited to, aluminum, copper, gold nickel, titanium, tungsten, platinum, as well as other metals, metal alloys, metal nitrides such as titanium or tantalum nitride, metal suicides such as tungsten silicide, or other metal-like materials.

Conventional laser-based semiconductor link processing systems focus a single pulse of laser output having a pulse width of about 4 to 30 nanoseconds (ns) at each link. The laser beam is incident upon the IC with a footprint or spot size large enough to remove one and only one link at a time. When a laser pulse impinges a polysilicon or metal link positioned above a silicon substrate and between component layers of a passivation layer stack including an overlying passivation layer, which is typically 2000-10,000 angstrom (Å) thick, and an underlying passivation layer, the silicon substrate absorbs a relatively small proportional quantity of infrared (IR) radiation and the passivation layers (silicon dioxide or silicon nitride) are relatively transparent to IR radiation. Infrared (IR) laser wavelengths (e.g., 0.522 μm, 1.047 μm, 1.064 μm, 1.321 μm, and 1.34 μm) have been employed for more than 20 years to remove circuit links.

Present semiconductor link processing systems employ a single laser pulse focused into a small spot for link removal. Banks of links to be removed are typically arranged on the wafer in a straight row, an illustrative one of which is shown in FIG. 1. The row need not be perfectly straight, although typically it is quite straight. The links are processed by the system in a link run 120, which is also referred to as an on-the-fly ("OTF") run. During a link run, the laser beam is pulsed as a stage positioner passes the row of links across the focused laser spot location. The stage typically moves along a single axis at a time and does not stop at each link position. Thus the link run is a processing pass down a row of links in a generally lengthwise direction (horizontally across the page as shown.) Moreover, the lengthwise direction of the link run 120 need not be exactly perpendicular to the lengthwise direction of the individual links that constitute the row, although that is typically approximately true. Impingent upon selected links in the link run 120 is a laser beam whose propagation path is along an axis. The position at which that axis intersects the workpiece continually advances along the link run 120 while pulsing the laser to selectively remove links. The laser is triggered to emit a pulse and sever a link when the wafer and optical components have a relative position such that the pulse energy will impinge upon the link. Some of the links are not irradiated and left as unprocessed links 140, while others are irradiated to become severed links 150.

FIG. 2 illustrates a typical link processing system that adjusts the spot position by moving a wafer 240 in an XY plane underneath a stationary optics table 210. The optics table 210 supports a laser 220, a mirror 225, a focusing lens 230, and possibly other optical hardware. The wafer 240 is moved underneath in the XY plane by placing it on a chuck 250 that is carried by a motion stage 260.

FIG. 3 depicts the processing of the wafer 240. A conventional, sequential link blowing process requires scanning the XY motion stage 260 across the wafer 240 once for each link run. Repeatedly scanning back and forth across the wafer 240 results in complete wafer processing. A machine typically scans back and forth processing all X-axis link runs 270 (shown with solid lines) before processing the Y-axis link runs 280 (shown in dashed lines). This example is merely illustrative. Other configurations of link runs and processing modalities are possible. For example it is possible to process links by moving the wafer, optics rail, or through beam deflection. In addition, link banks, and link runs may not be straight rows and may not be processed with continuous motion.

For this example, the primary system parameters that impact the time spent executing link runs, and thus throughput, are the laser pulse repetition frequency (PRF) and motion stage parameters such as stage acceleration, bandwidth, settling time, and the commanded stage trajectory. The commanded stage trajectory consists of acceleration and deceleration segments, constant velocity processing of link banks, and "gap profiling" or accelerating over large gaps between links to be processed in a link run. Most improvements to system throughput over the past several years have primarily focused upon enhancing the stage and laser parameters. Improvements in these areas will continue; however, practical limitations associated with these parameters make this a difficult way to achieve large throughput gains.

Increasing peak stage acceleration, for example, provides only a limited throughput improvement. Present motion stages are capable of moving a wafer with a full field travel, greater than 300 mm (millimeters), with 1 to 2 G accelerations, while maintaining a positional accuracy on the order of 100 nm (nanometers). Increasing stage acceleration introduces additional vibrations and generates heat, both of which can decrease system accuracy. Significantly increasing the stage acceleration and bandwidth, without diminishing the positional accuracy or increasing the system footprint, is a challenging and costly engineering endeavor, and the benefits of that effort would only be moderate.

Increasing the laser PRF, and hence link run velocity, is also undesirable for a number of reasons. First, there are unfavorable changes in the laser pulses that result from increasing the PRF. For a given laser cavity, as the inter-pulse period decreases, the laser pulse width increases. This may decrease the processing efficiency on some link structures. Higher laser PRFs are also associated with less energy stability, which also decreases processing efficiency. Higher laser PRFs can also result in lower pulse power, although that is usually not a problem when processing links that use a small spot size.

High laser PRFs are also undesirable when applied to semiconductor products that have a large link pitch. The combination of high PRF and large link pitch requires that a very high stage velocity be used for processing links. A high stage velocity requires more stage acceleration and deceleration and decreases the opportunity to take advantage of gaps of unprocessed links in a run. These effects diminish some of the throughput improvements from the higher link run velocity. A high stage velocity also requires a tighter timing tolerance when triggering the generation of laser pulses in order to maintain accuracy. Processing at high stage velocities may also not be possible if these velocities exceed some system specification, such as the maximum stage or position feedback sensor velocity.

Continued shrinkage of the feature sizes on semiconductor wafers will result in an increased number of links and link runs to process these wafers, further increasing wafer processing time, while future system throughput improvements of significant magnitude are unlikely to occur through improvements in stage acceleration performance or laser PRF.

SUMMARY

According to one embodiment, a method processes a semiconductor substrate having a plurality of structures (e.g., electrically conductive links) to be selectively irradiated with multiple laser beams. The links are arranged in a plurality of substantially parallel rows extending in a generally lengthwise direction. The method generates a first laser beam that propagates along a first laser beam axis that intersects a first target location on or within the semiconductor substrate. The method also generates a second laser beam that propagates along a second laser beam axis that intersects a second target location on or within the semiconductor substrate. The second target location is offset from the first target location in a direction perpendicular to the lengthwise direction of the rows by some amount such that, when the first target location is a structure on a first row of structures, the second target location is a structure or between two adjacent structures on a second row distinct from the first row. The method moves the semiconductor substrate relative to the first and second laser axes in a direction approximately parallel to the rows of structures, so as to pass the first target location along the first row to irradiate for a first time selected structures in the first row, and so as to simultaneously pass the second target location along the second row to irradiate for a second time structures previously irradiated by the first laser beam during a previous pass of the first target location along the second row.

According to another embodiment, a system processes a semiconductor substrate having a plurality of electrically conductive structures to be selectively irradiated with multiple laser beams. The structures are arranged in a plurality of substantially parallel rows extending in a generally lengthwise direction. The system comprises a laser source, a first laser beam propagation path, a second laser beam propagation path, and a motion stage. The laser source produces at least a first laser beam and a second laser beam. The first laser beam propagation path goes from the laser source to the semiconductor substrate and has a first laser beam axis that intersects a first target location on or within the semiconductor substrate. The second laser beam propagation path goes from the laser source to the semiconductor substrate and has a second laser beam axis that intersects a second target location on or within the semiconductor substrate. The second target location is offset from the first target location in a direction perpendicular to the lengthwise direction of the rows by some amount such that, when the first target location is a structure on a first row of structures, the second target location is a structure or between two adjacent structures on a second row distinct from the first row. The motion stage moves the semiconductor substrate relative to the first and second laser axes in a direction approximately parallel to the rows of structures, so as to pass the first target location along the first row to irradiate for a first time selected structures in the first row, and so as to simultaneously pass the second target location along the second row to irradiate for a second time structures previously irradiated by the first laser beam during a previous pass of the first target location along the second row.

As used herein: the term "on" means not just directly on but atop, above, over, or covering, in any way, partially or fully; the term "substantially" is a broadening term that means about or approximately but does not imply a high degree of closeness; and the term "adjacent" means next to or next in a series (e.g., the letter "F" is adjacent to "G" but not "H" in the alphabet) without implying physical contact.

Additional details concerning the construction and operation of particular embodiments are set forth in the following sections with reference to the below-listed drawings.

DETAILED DESCRIPTION OF EMBODIMENTS

Figure 1:
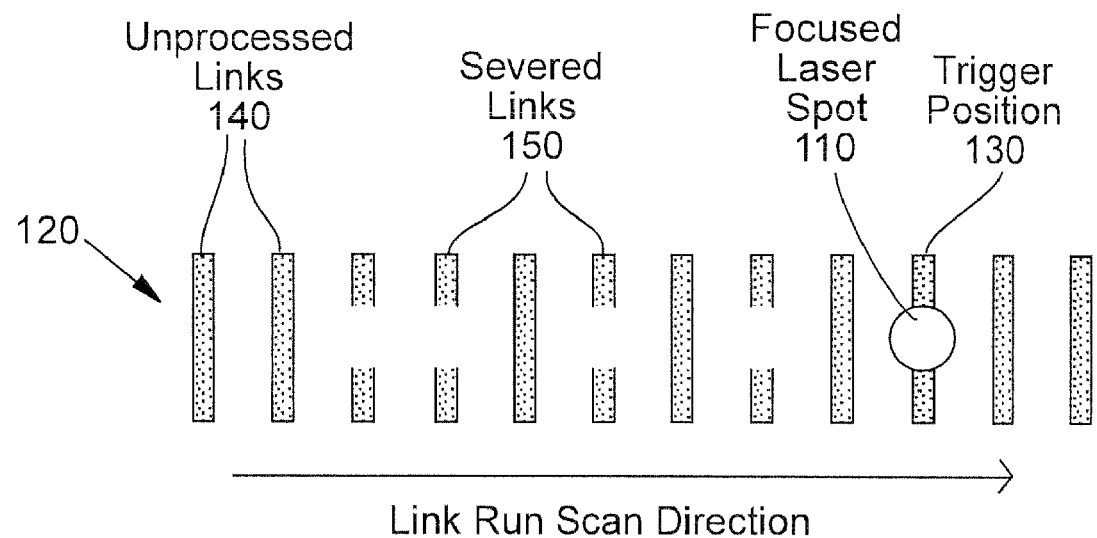
FIG. 1 is a diagram of a row or bank of links being selectively irradiated with a laser spot scanning along the lengthwise direction of the bank.
Figure 2:
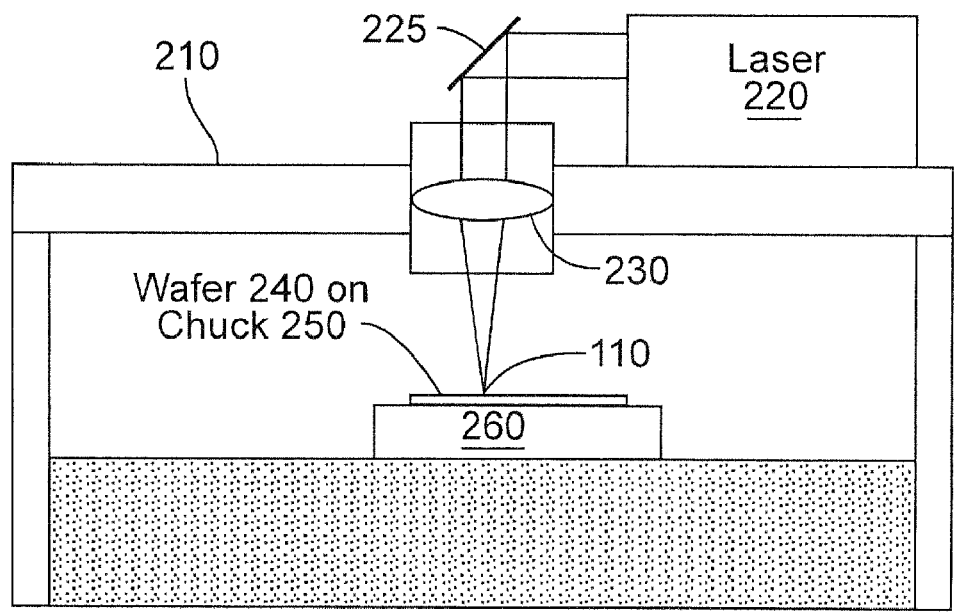
FIG. 2 is a diagram of a link processing system.
Figure 3:
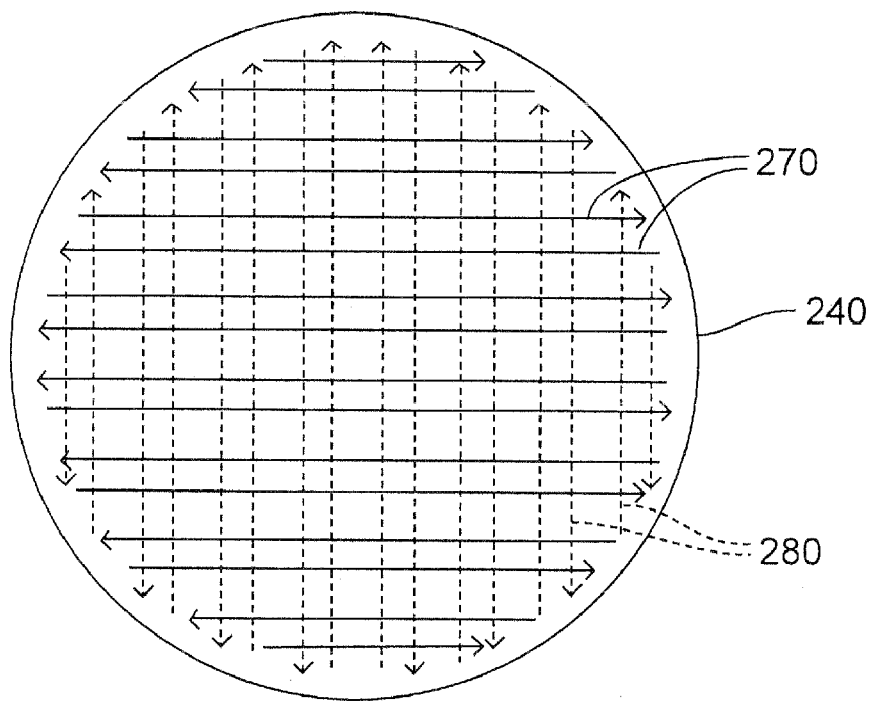
FIG. 3 is an illustration of link runs on a semiconductor wafer.

With reference to the above-listed drawings, this section describes particular embodiments and their detailed construction and operation. The principles, methods, and systems disclosed below have general applicability for processing any structure on or within a semiconductor substrate using laser radiation for any purpose. While the examples and embodiments that follow are described in the context in which those structures are laser-severable links on or within an IC (e.g., memory device, logic device, optical or optoelectronic device including LEDs, and microwave or RF devices), other structures besides laser-severable links can be processed in the same or similar manner, and the teachings set forth herein are equally applicable to the laser processing of other types of structures, such as electrical structures that become conductive as a result of laser radiation, other electrical structures, optical or electro-optical structures, and mechanical or electro-mechanical structures (e.g., MEMS (micro electromechanical structures) or MOEMS (micro opto-electro-mechanical structures)). The purpose of the irradiation may be to sever, cleave, make, heat, alter, diffuse, anneal, or measure a structure or its material. For example, laser radiation can induce a state change in a structure's material, cause the migration of dopants, or alter magnetic properties—any of which could be used to connect, disconnect, tune, modify, or repair electrical circuitry or other structures.

As one skilled in the art will appreciate in light of this disclosure, certain embodiments are capable of achieving certain advantages over the known prior art, including some or all of the following: (1) increasing throughput, possibly by multiplicative factors, e.g., by a factor of 2, 3, 4, etc.; (2) decreasing floor space required for link processing equipment in a fabrication facility; (3) decreasing the time elapsing between scanning alignment targets and completing link processing, thereby (a) allowing less time for thermal drift of the components and structure of the semiconductor processing system, resulting in enhanced system accuracy, (b) enabling larger wafer processing fields, which results in longer link runs and an additional throughput improvement, and (c) permitting less frequent rescanning of alignment targets when thermal shifts are detected or when the time elapsed since their previous scan becomes too large, thus further enhancing throughput by reducing the number of operations necessary for accurate link processing; and (4) allowing beneficial relaxation of some present system parameters, such as XY stage acceleration and laser pulse repetition frequency, while still processing wafers at a rate that is equivalent or faster than present link processing systems. As an example of the latter advantage, lowering the stage acceleration requirements can reduce the thermal energy released into the system environment, reducing thermal shifts that occur during wafer processing; lower acceleration will also improve accuracy by reducing the excitation of system resonances and vibrations, resulting in smoother, gentler, more stable system operation; motion stages can also be selected with a lower cost, preferential mechanical configuration, greater simplicity, and no need for auxiliary cooling systems if a reduced acceleration is acceptable. As another example, a laser source with a lower PRF could be used for processing; lower PRF lasers have improved pulse properties such as faster rise time, enhanced pulse stability, increased peak pulse power, and shorter pulse width; lower PRF lasers may also be less costly and may be operable with smaller power supplies that generate less heat.

These and other advantages of various embodiments will be apparent upon reading the remainder of this section.

I. Analysis of Link Run Processing Time

Measurements from the repair of typical DRAM wafers show that the time to execute link runs accounts for the majority of wafer processing time. Approximately 85% of total processing time may be spent executing link runs, and the remaining 15% is spent performing overhead tasks, such as moving the wafer to shift the cutting laser from the end of one link run to the start of the next link run, alignment, focusing, and computational overhead. Because the dominant component of link processing time is typically spent executing link runs, significant reductions in wafer processing time can result from reducing the time spent executing link runs.

Figure 4:
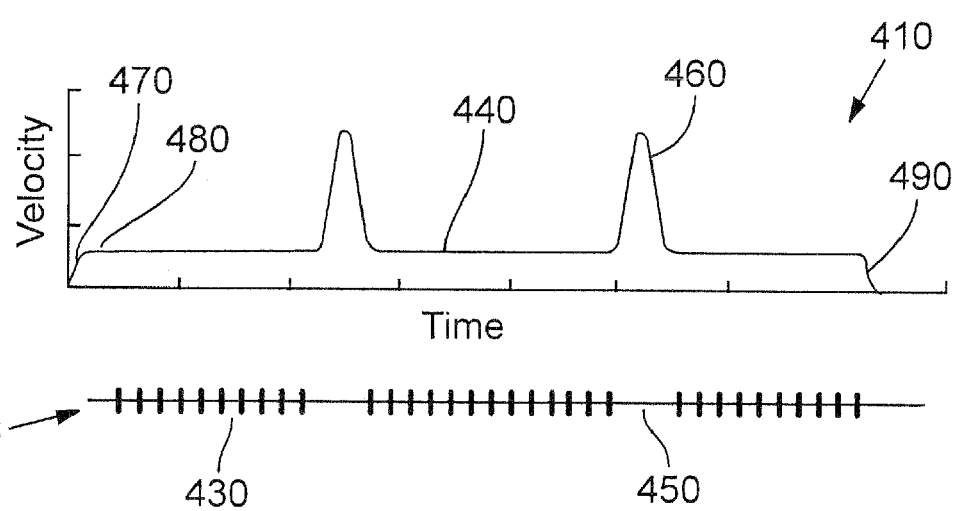
FIG. 4 is a velocity profile plot of a single link run.

FIG. 4 illustrates a link run velocity profile 410 corresponding to the processing of a link run 420. As used herein, the term "velocity profile" means velocity as a function of time or distance over a span of time or an interval of distance. Link run execution consists of a number of different operations. While processing a bank 430 of links with a tight pitch spacing (e.g., the center-to-center distance between adjacent links in the same bank), the laser beam axis advances relative to the wafer at a nearly constant velocity 440. Note that, although FIG. 4 shows an example in which the constant velocity 440 is the same for each link bank 430 in the link run 420, it is possible that different link banks 430 may have different constant velocities, such as when the pitch spacing differs from bank to bank in the same link run. When there is a large gap 450 between subsequent links in a link run, the system accelerates to span the gap 450 in less time and then decelerates near the end of the gap to reach a nominal velocity once again. That acceleration and deceleration result in a gap profile 460 in the link velocity profile 410. At the beginning of a link run, the system undergoes an initial acceleration 470 from a resting position followed by a period of settling 480. At the end of a link run, the system undergoes a deceleration 490 back down to zero velocity. Thus, the typical operations that the system performs during execution of a link run include ramping up the stage to constant velocity, settling, processing links at constant velocity, accelerating (gap profiling) over any large gaps, and ramping back down to zero velocity at the end of the run. FIG. 4 illustrates the effect of these operations on link run on-axis velocity. Note that while the link run 420 is depicted as a straight line through co-linear link banks, it is possible for the banks of links to not be in line. Link run 420 would then contain lateral position commands as well.

Insight into system improvements for reducing link run execution time are evident from the following simplified throughput prediction model. The model approximates the time required for link run execution. The model is not accurate for absolute time prediction because it does not fully model all system behavior, such as move profiling; however the relative impact of changing different processing parameters is correct. According to this model, the time required to process the links is $$T_{LR}=N_{LR}(\overline{D}_{LR}/\overline{V}_{LR}+T_{accel}+T_{settle}+T_{decel}-T_{gap\ savings}). \quad (1)$$

In Equation (1), $T_{LR}$ is the total link run execution time and $N_{LR}$ is the total number of link runs. The terms in parenthesis can be lumped into three categories: (1) time spent to span all the link runs at constant velocity, (2) time spent to accelerate, settle, and decelerate during link runs, and (3) time saved by gap profiling.

The average time spent on a link run at constant velocity is described by $\overline{D}_{LR}$ the average link run distance and $\overline{V}_{LR}$ the average link run velocity. This velocity is typically $\overline{V}_{LR}=P_{link}F_{laser}$ where $P_{link}$ is fundamental link pitch spacing and $F_{laser}$ is the laser PRF.

A rearrangement of the terms of Equation (1) that pertain to constant link run velocity shows that the total time spent at constant velocity is $T_{Vconst}=N_{LR}\overline{D}_{LR}/\overline{V}_{LR}=D_{total}/\overline{V}_{LR}$. This can be restated as follows: The total time required to process the link runs at constant velocity is the total link run distance $D_{total}$ divided by the link run velocity.

For the simplified throughput model, the time required to accelerate to the link run velocity or decelerate from link run velocity is $T_{accel}=T_{decel}=\overline{V}_{LR}/A_{stage}$ where $A_{stage}$ is the stage acceleration, and the additional time required to elapse at the end of the acceleration phase before processing links is the settling time, denoted $T_{settle}$. In actual implementations, more complex acceleration and deceleration profiles, such as half-sine or trapezoidal profiling, are employed.

The final term in Equation (1), $T_{gap\ savings}$, is a measure of the average time saved on a link run by gap profiling. A gap profiling operation involves accelerating, decelerating, and settling to travel between two links in less time than would be required at constant velocity. This magnitude of this term is dependent upon the quantity and spacing of large gaps between links, the acceleration capabilities of the stage, the settle time, and the link run velocity. A greater time savings results on products that have many large gaps in link runs and a small link pitch, hence a lower link run velocity.

The relative size of the three terms gives further insight into the importance of different system changes. The time spent accelerating and decelerating at the start and end of link runs is approximately 1.5% of the time spent on link runs. The time saved with gap profiling is approximately 50% of the time that would be required to traverse the link runs at constant velocity. These numbers vary widely for different types of wafers. Workpieces with few or no large gaps between links will not receive any benefit from gap profiling. On the other hand, products with sparse or random link layout receive greater benefit from gap profiling.

II. Parallelism in General

Parallel link processing by producing, and perhaps independently controlling, multiple laser spots on a wafer surface can dramatically improve system throughput.

In one implementation, the use of two focused laser spots allows one physical pass of the wafer under the lens to result in the processing of two rows of links. Equation (1) shows that when processing multiple laterally spaced link runs simultaneously, the link run execution time is divided by the number of spots. For a two spot system, the XY stage only needs to traverse the wafer by $N_{LR}/2$ times. The total link run distance that the stage must travel is divided by two, and the number of acceleration, deceleration, and settling events at the beginning and end of each link run is also divided by two. Although gap profiling time savings may be divided by a number that approaches two, depending upon link layout, the net result is that a laser system with two laterally spaced spots requires about half the link run execution time.

The throughput improvements that result from multiple spot systems are much larger than can be accomplished through improvements to motion stage performance and laser PRF in a single spot system. In addition, these throughput improvements occur without any of the undesirable consequences of pressing the laser and motion stage to higher performance.

Multiple spot processing may take many different forms, with laser pulses being delivered to links with a different lateral (cross-axis) spacing, different on-axis spacing, different on-axis and cross-axis spacing, or no difference in link spacing. Each of these different configurations offers different throughput and processing advantages and are explained in greater detail next, with reference to FIG. 5.

Figure 5:
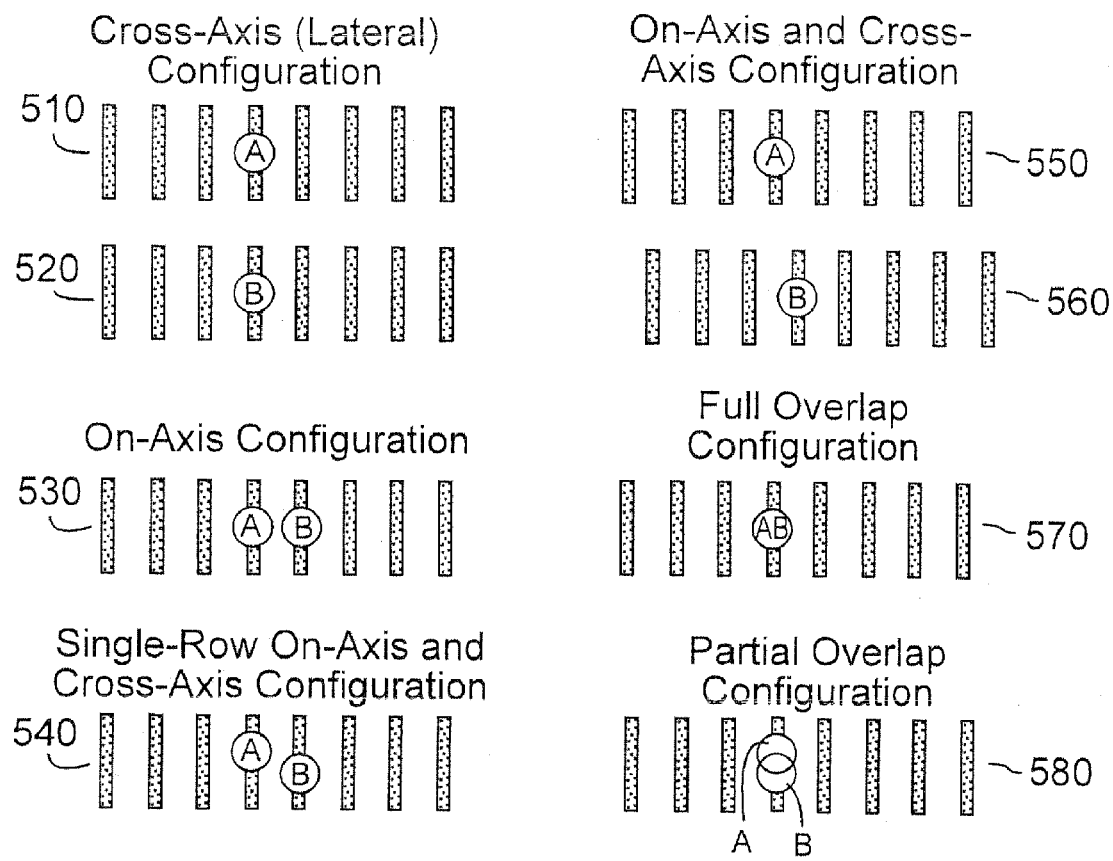
FIG. 5 is an illustration of various two-spot arrangements, according to various embodiments.

FIG. 5 depicts links being processed with some of the possible spacings of two laser spots. The two laser spots are denoted "A" and "B" in the figure. In the laterally (or cross-axis) spaced arrangement, spot A is on a link in one bank 510, while spot B is offset on a corresponding link in a different, typically parallel, bank 520. Because spots A and B preferably advance in unison horizontally across the link runs 510 and 520, as depicted in FIG. 5, the two spots can be said to be displaced relative to one another in the cross-axis direction, with respect to the direction of spot motion. Although we say that spots A and B advance along their respective link banks, that is a linguistic shorthand. More precisely, a spot results from a laser beam when the laser beam is on. In the case of an intermittent laser beam, such as a pulsed laser beam, the resulting spot on the IC workpiece comes and goes as the laser beam turns on and off. However, the laser beam propagates along an axis of propagation, and that axis always exists whether the beam is on or not. Thus, to be precise, a laser beam axis moves along the link run. At any given time during a link run, the axis intersects the IC workpiece either on a link or between two adjacent links. When a laser beam axis intersects a link that has been selected for removal, the laser beam is energized to sever the link. When the laser axis is moving along a bank of regular spaced links (with the approximately uniform pitch), the laser beam can be pulsed periodically at a rate equivalent to and synchronized in phase with the axis's crossing of links. The laser pulses can be selectively passed or blocked to sever a given link or leave it intact.

While the spots A and B are illustrated as having a circular shape in FIG. 5 and others, they may have any arbitrary shape that a laser beam can produce.

As already mentioned, an advantage of laterally spaced spots is that wafer processing can be accomplished with fewer link runs, resulting in much greater throughput without any laser or motion stage enhancements. Thus, from the perspective of increasing throughput, this is a valuable form of parallelism. However, parallelism can take a variety of forms, which can offer various advantages.

In an on-axis arrangement, spots A and B are on different links in the same link bank 530 and may be substantially aligned along the axis of spot motion. Although spots A and B are directed on adjacent links in the FIG. 5 illustration, that need not be the case; for example, spot A may lead spot B by two or more links, or vice versa. Advantages of on-axis spaced laser spots include the following: (1) link run velocity can be increased to enhance throughput, because the spots can advance twice as far between pulses; (2) multiple laser pulses can be delivered to a link during on-the-fly processing without repeating a link run; and (3) laser pulses with different properties can be selectively applied to a link.

Hybrids of both cross-axis and on-axis spacing are also possible, as shown in two illustrative examples in FIG. 5. In one arrangement, spots A and B may be offset along the lateral axis while remaining on the same row or bank 540 of links. Advantages of that single-row on-axis and cross-axis hybrid arrangement include better dissipation of energy in the area between the two spots, as they are separated by a somewhat greater distance than in the case without any cross-axis offset. In another arrangement, spots A and B fall on different banks 550 and 560 and are offset in the on-axis direction as well. As IC feature sizes continue to shrink, an on-axis offset between laterally spaced spots on adjacent rows can also result in better laser energy dissipation in the vicinity of the two spots, especially when pulsed simultaneously. Note that processing in the on-axis and cross-axis configuration is possible with nearby link banks that are staggered, as shown in the on-axis and cross-axis configuration of FIG. 5, or regularly arranged as in the layout of the cross-axis (lateral) configuration case.

Furthermore, in an overlap configuration, as shown twice in FIG. 5, spots A and B can be partially or substantially fully overlapping on the same link in the same link bank 570 (full overlap) or 580 (partial overlap). Advantages of multiple overlapped laser spots are that (1) laser spots with different optical properties can be selectively delivered to a link and (2) combining laser pulses that arrive at slightly different times is a method for temporally shaping the effective combined pulse profile.

The two laser spots A and B may be processed simultaneously or sequentially. Simultaneous processing can result, for example, by splitting a single laser beam into multiple spots or triggering two lasers to emit at the same time. Simultaneous delivery means at substantially the same time so that the time delay between pulse A and pulse B, at a link run velocity $V_{LR}$, does not result in drift of the blow positions to such an extent that the drift is a substantial fraction of the focused beam spot diameter. For example, with a link run velocity of 200 mm/sec and a desirable spot shift of less than 10% of a 2 micron focused spot size, pulses arriving within 1 μsec of one another would be considered simultaneous. Minor differences in the lengths of optical beam paths would result in time delays between pulses that are much less than this value, typically less than about 10 nsec.

Sequential spots, either generated from a single laser pulse that is split and has long optical delay paths or generated from multiple laser pulses with a dwell between triggers, impinge upon the links with greater time separation. Sequential spots may be utilized with multiple beam paths by adjusting the relative positions of the focused laser spots on the target semiconductor wafer such that the focused spots are properly positioned when pulse generation is triggered.

For multi-spot processing, the triggering of lasers to generate a pulse may be based purely upon timing signals, or may be based upon actual, measured, estimated, or commanded positions of a spot, the workpiece, or the workpiece relative to the spot. Pulse generation may also be triggered based upon average positions or estimated positions of multiple spots relative to multiple targets.

The subsequent sections describe various aspects of the various forms of parallelism illustrated in FIG. 5.

III. Laterally Spaced Spots

Creating two or more focused laser spots that impinge upon adjacent laterally (Cross-Axis) spaced banks of links is one configuration for improving system throughput. By processing two or more banks of links simultaneously, the effective number of link runs and the distance the XY motion stage must travel during wafer processing is reduced by the number of laterally focused laser spots. For example, a wafer previously requiring 1000 link runs with a single spot could be processed with only 500 duplex link runs, where each duplex link run results in the processing of two laterally spaced banks of links. Cutting the number of link runs in half results in a similar reduction in the time required to process the wafer. More generally, the use of N laterally spaced spots results in an throughput improvement on the order of N.

Laterally spaced spots typically improve throughput more than other spot configurations. Furthermore, the improvement in throughput poses no new demands on the XY motion stage 260 or laser pulse rate requirements because laterally spaced spots on separate rows can process those separate rows simultaneously with the same velocity 440 as a single-spot system. However, when processing multiple rows during one link run it becomes more important to perform the run at a velocity that is compatible with all rows being processed. A compatible velocity profile for N distinct rows to be processed jointly is a velocity profile that is feasible, practicable, suitable, or appropriate for all of the N parallel processes. Issues of velocity compatibility typically manifest themselves in three primary forms. First, the constant velocity 440 for processing multiple parallel rows should be compatible with all of the processed rows. That can be ensured by utilizing a joint constant velocity that is the minimum of the constant velocities 440 for the individual link runs. In the typical case in which each row of links has the same pitch spacing, the constant velocities for each run is the same; thus, ensuring that the joint constant velocity 440 is compatible incurs no performance penalty. Second, gap profiling should be compatible with all of the processed rows. That can be ensured by employing a gap profile 460 only where all processed rows have aligning gaps. Third, in cases in which the constant velocity 440 may differ for different link banks 430 within the same link run 420, a simplification results from restricting link processing to constant velocity link runs, rather than allowing link run velocity to vary from one link bank 430 to another. In general, a joint velocity profile for simultaneously processing multiple rows should be computed with all of the link coordinates of the parallel link runs taken into consideration for minimum pitch, appropriate areas for gap profiling, ramp-up and ramp-down locations, and specific individual link run velocity profiles. Furthermore, where different laser sources have different properties affecting the achievable velocity, such as PRF, those factors should also be taken into account.

According to one embodiment, a joint velocity profile is computed by first computing the individual velocity profiles for each constituent row in the run, and constructing a joint velocity profile that does not exceed the smallest maximum velocity value of any of the individual profiles at each point along the profile. For example, if a first row must be processed at 125 mm/s or less in a segment, and a second row must be processed at 100 mm/s or less in the same segment, then the joint velocity profile should be at 100 mm/s or less in that segment.

According to another embodiment, a joint velocity profile is determined by computing the velocity profile for a single set of master link coordinates. The set of master link coordinates is generated from some or all of the link coordinates in the N rows being processed in parallel. The offset from each master link coordinate to a link coordinate in some or all of the N rows being processed jointly is determined, as well as information about whether each of the N pulses will be blocked or transmitted to a target coordinate. The offset from the set of master link coordinates to one of the N rows being processed may be zero. One way to process the parallel link runs is to use information derived from the offset coordinates to command motion of the beam steering mechanisms, information derived from the set of master link coordinates to facilitate generation of laser pulses, and information about transmitting or blocking each of the N pulses to direct the switches that transmit or block pulses.

Software in the form of executable instruction code is a preferred method of computing a joint velocity profile.

To maximize joint velocity, the constituent link runs should be as spatially similar as possible. In other words, the same or similar pitch spacing should be utilized in corresponding banks of different constituent runs, and banks and gaps should be aligned when possible. In this way, intelligent layout of the links on the IC can facilitate laterally spaced, multi-spot link processing that maximizes the throughput advantage that such link processing can offer.

Throughput improvements involving laterally spaced spots do not require an increase in stage velocity, as opposed to on-axis spaced spots which, for example, may require doubling the stage velocity of a single beam system. For this reason laterally spaced spots, which may also include an on-axis offset, are a preferred method of increasing throughput in systems that use high PRF lasers, such as those exceeding 30 kHz. As an example, the basic link run velocity using a 40 kHz PRF laser and a 3 μm fuse pitch is 120 mm/s. Processing multiple link runs with laterally spaced spots would use the same link run velocity. However, a two-spot system with on-axis spaced spots would preferably employ a 240 mm/s link run velocity, which exceeds the stage velocity limit of present semiconductor processing systems.

Figure 6:
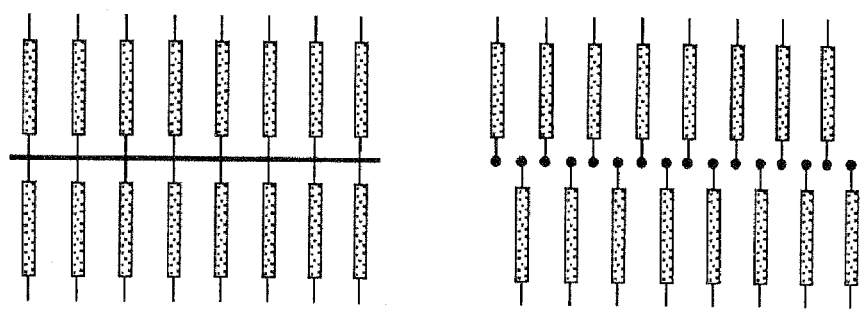
FIG. 6 is an illustration of two different cases of two link rows in relation to one another.

Laterally spaced spots are also a natural choice for use on many present semiconductor link layouts. A number of semiconductor device manufacturers produce products containing parallel link banks separated by a distance of less than 200 μm. Center-to-center separation distances of 10 μm or less are common. These types of link layouts presently result because the width and separation distance of traces within semiconductors are typically smaller than the width and pitch spacing of laser severable semiconductor links. Offset or staggered fuse designs result from trying to pack the larger semiconductor links into a short on-axis distance, as shown in FIG. 6. In some of these designs, the links have a purely lateral translation (shown on the left). In other designs there is also an on-axis offset (shown on the right). The benefits of multiple-spot link processing with a pure on-axis spacing also apply to processing with both an on-axis and a cross-axis spacing.

While the layout of many semiconductor designs is presently compatible with simultaneous processing of laterally spaced link banks, designers are trying to shrink the dimensions of laser severable fuses to eliminate the offset and staggered link configurations of FIG. 6 by laying out fuses in a single row. This would enhance throughput on present single-spot systems.

To take greater advantage of multi-beam link processing, IC designers can deliberately design semiconductor link layouts to be compatible with multi-beam link processing. Creating products with a link layouts targeted towards multi-beam processing, and in particular multi-beam processing with laterally spaced spots, may result in a dramatic increase in throughput when processed on multi-beam systems. Desirable link layouts for use with laterally spaced spots include link banks with a nearby center-to-center spacing, typically 10 μm or less, but possibly 1 mm or more. It is also desirable to maximize system performance by laying out the majority of links and link banks such that they can be processed with laterally spaced spots.

In one embodiment, a single laser pulse is split, with half the energy delivered to spot A and half to spot B. The use of optical switches can independently select whether the pulses will be delivered to A or B, allowing the desired links to be properly severed.

Figure 7:
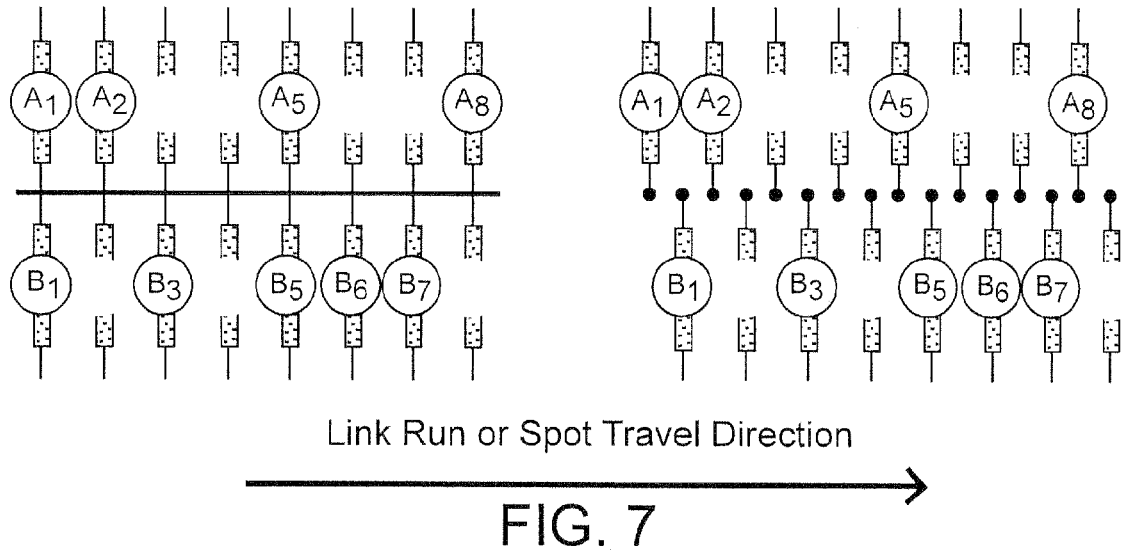
FIG. 7 is an illustration of two laterally spaced laser spots processing the two cases of FIG. 6, according to one embodiment.

FIG. 7 shows how a duplex link run might progress. A pair of laser spots $A_1$ and $B_1$ correspond to a first laser pulse that has been split and applied to two links. The next pulse emitted from the laser would impinge upon the next two links as focused spots $A_2$ and $B_2$. Optical switches can select which pulses reach their target links. In the two examples depicted, pulses $A_3$, $A_4$, $A_6$, $A_7$, $B_2$, $B_4$, and $B_8$ reach and remove their target links. The other pulses are blocked, so they do not reach or alter any links.

In some cases, it is desirable to process links twice. Making two or more passes along the link run to blow the links two or more times can be easily accomplished with a multiple-spot link processing system. Because of the parallelism inherent to a multiple-spot link processing system, this can be accomplished significantly faster than with a single-spot link processing system. Subsequent passes along a given bank of links may include a lateral shift of the focused laser spots so that the links are processed with different laser spots on each pass across the wafer. For example, a first pass along a link run may selectively hit the links with spot A, and a second pass along the link run may hit those same spots again with spot B while spot A advances along a new link run.

It may also be useful to process wafers using multiple laterally spaced spots having different optical properties. Different optical properties can be achieved by inserting additional optical elements for changing polarization, spot spatial distribution, spot size, wavelength, pulse energy, or other optical property. Different optical properties can also be achieved by using different laser sources.

Since semiconductor wafers typically only contain one link design, the use of spots with different optical properties would most likely be applied in a double blow scenario. The first blow would partially remove the link and the second blow would clean out the blown link. Alternatively, the first blow may be passed or blocked and the second blow would be passed or blocked, resulting in the application of one or the other spot to the link. This is desirable in situations where different link properties or orientations make it preferable to process with different laser spots. For example, if it is desired to process links with a polarized spot where the polarization direction corresponds to one axis of the link, spots A and B can be configured with different polarizations and applied to links with different orientations on the workpiece. Application of spots with different optical properties will be further detailed in subsection VI of this document.

While it is possible to use fixed optics in order to generate multiple laterally spaced spots with a fixed offset, it is preferable to be able to reconfigure the spot locations. Because most typical semiconductor products contain link layouts requiring link runs in both the X and the Y axes, it is desirable to be able to reconfigure the spot translator so that a lateral spot spacing can be created for either link run direction. It is also desirable to be able to configure and adjust the spot spacing to match different link layouts.

IV. On-Axis Spaced Spots

Multiple spots distributed with an on-axis spacing, adjusted fore and aft along the axis of a link run, offer throughput and multiple-blow advantages. In terms of throughput, this orientation can effectively increase the laser PRF and link run velocity $V_{LR}=P_{link}F_{laser}N_{spot}$ by the number of spots $N_{spot}$. In the case of two on-axis spaced spots, for example, the link run velocity doubles. However, there may be less time savings through gap profiling due to the increased base link run velocity.

The velocity profile of each link run should in most cases be computed with all of multiple blow coordinates taken into consideration for, e.g., minimum pitch, appropriate areas for gap profiling, ramp-up and ramp-down locations, and specific link bank velocity profiles. Computation of link run velocity profiles is known to those in the art.

Figure 8:
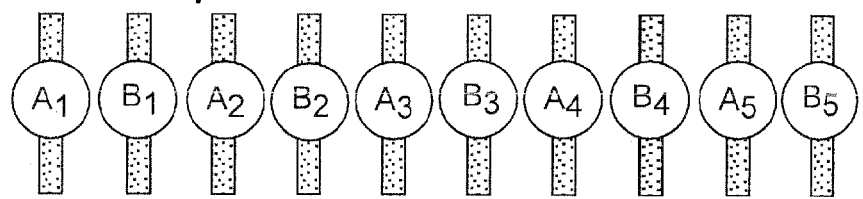
FIG. 8 is an illustration of two-spot and three-spot examples of on-axis arrangements of laser spots, according to two embodiments.
Figure 8:
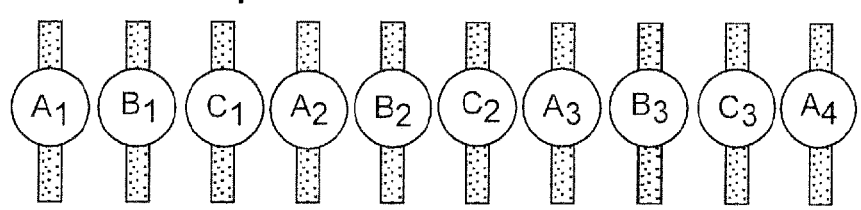

FIG. 8 depicts a bank of links being processed by two- and three-spot implementations of multiple on-axis laser spots. In one implementation, spots A and B—or A, B, and C—can originate from a single laser pulse and arrive at the work surface at substantially the same time. Optical switches controlled by the link processing system allow some pulses to reach the surface and sever links and other pulses to be blocked. In the two-spot case (top) shown in FIG. 8, spots $A_1$ and $B_1$ are processed approximately simultaneously, then $A_2$ and $B_2$, then $A_3$ and $B_3$, etc. In the three-spot case (bottom) the three laser spots together advance in increments of three along the link run ($A_1$, $B_1$ and $C_1$; then $A_2$, $B_2$ and $C_2$; then $A_3$, $B_3$ and $C_3$, etc.)

Implementing a fixed displacement or a steering mechanism to translate laser spots by a distance greater than a single link pitch can prevent simultaneous processing of adjacent links. It is undesirable to simultaneously process two adjacent links because of the increased pulse energy that must be absorbed by the workpiece in the area between the adjacent links. This increased pulse energy can cause damage that would not occur if the two adjacent links were not processed simultaneously. In other words, when the distance between spots is a multiple two or greater times the pitch spacing, non-adjacent spots can be processed at the same time with less likelihood of causing damage to the workpiece.

Figure 9:
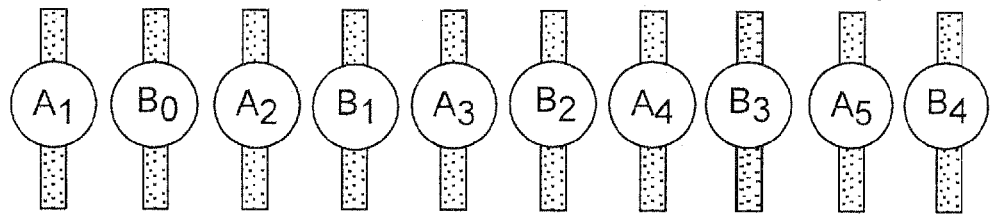
FIG. 9 is an illustration of a two-spot on-axis arrangement of laser spots for processing a row in one pass, according to one embodiment.

When the spacing between spots is an odd multiple of the link pitch (so that laser spots fall upon, e.g., links 1 and 4, links 1 and 6, or links 1 and 8, etc.), on-axis parallelism can be utilized advantageously because one spot can process the "even" links in the link run while another spot processes the "odd" links. Such a spacing can also be described as spacing the spots such that the number of links between the spots (not counting the endpoints) is an even number. In this case, link run velocity can be doubled while preventing the increased energy that could result from adjacent laser spots. FIG. 9 illustrates on-axis spacing with an increment of three link pitches (two links between the spots). This technique can be generalized to more than two spots where all combinations of spots have an on-axis separation greater than the link pitch.

Figure 10:
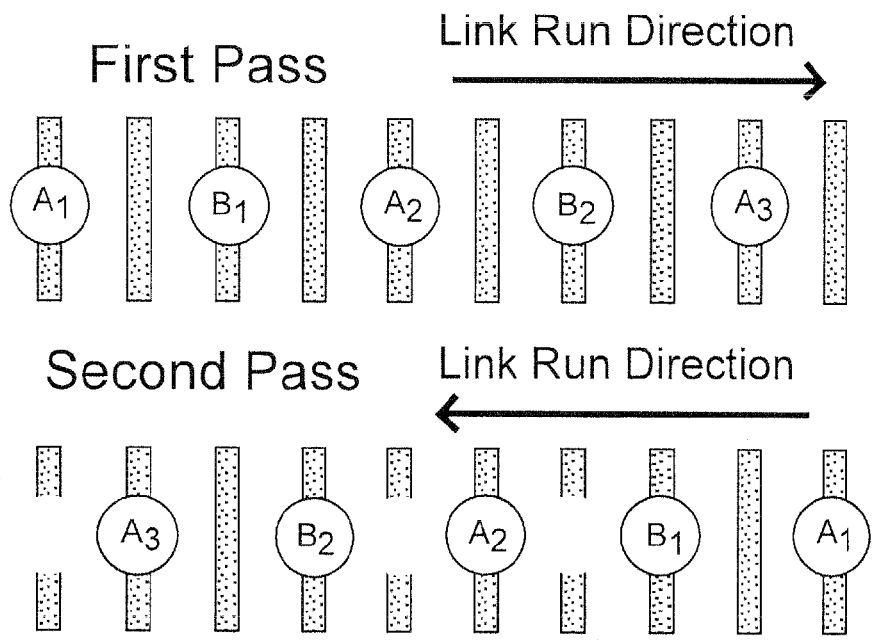
FIG. 10 is an illustration of a two-spot on-axis arrangement of laser spots for processing a row in two passes, according to one embodiment.

A second way to process wafers with on-axis spots spaced by more than one link pitch is to make two passes across a bank of links. An example of this is illustrated in FIG. 10. A first pass can selectively blow every other link with two laser spots with a spacing of twice the minimum pitch, for example. The second pass can selectively blow the interspersed links that were skipped on the first pass. Because the link run velocity is four times the velocity of the same laser applied to a single spot, two passes may be completed and still improve system throughput. In FIG. 10, on the first pass pulses $A_1$, $A_2$, and $B_2$ reached and removed link structures. The other pulses were blocked, but could have been applied to links. Even though different link run directions are depicted in FIG. 10, the passes could have been completed with link runs in the same direction.

Multiple spots with an on-axis spacing can also be used to efficiently deliver multiple blows to a link. For example, some semiconductor manufacturers prefer to provide one pulse to sever the link followed by a second pulse to clean up the area and any residual link material. An arrangement of multiple spots with an on-axis spacing is an effective way to deliver multiple pulses without making a second link run, as would happen in a single-spot system.

An alternative way to deliver multiple blows to a link is to make multiple passes down each link run. Because the link run velocity is greater in a multiple-spot system than a single spot system, a multiple-spot system is preferable for this type of operation.

These techniques and hybrid combinations of these techniques can be used to provide two or more blows to each link, and each blow may have the same pulse property or different pulse properties.

Different optical properties can be achieved by inserting additional optical elements for changing polarization, spot spatial distribution, spot size, wavelength, pulse energy, or other optical property. Different optical properties, such as, for example, pulse width, can also be achieved by using different laser sources. This can be particularly useful for applying multiple blows to a link. One scenario would be to apply a first pulse to a link, say at a higher energy level to blow the link, and then following with a second pulse of lower energy to clean out any residual material. Application of spots with different optical properties will be further detailed in subsection VI below.

V. Combinations of Lateral and On-Axis Spacing

Different methodologies for spacing multiple laser spots with on-axis and cross-axis offsets offer different processing advantages. The dual-row configuration shown on link banks 550 and 560 in FIG. 5 offers the same advantages (e.g., enhanced throughput) as spots with a cross-axis spacing described above. Staggered links are not required for this on-axis and cross-axis spacing technique. It can also be applied to the regularly spaced links of the first example in FIG. 6. Processing a single row at a time with an on-axis and cross-axis offsets of the focused laser spots (e.g., as shown on link run 540 of FIG. 5) lowers the laser fluence that reaches the silicon between the two link blows. The increased distance between the two spots when processing in this configuration reduces the overlapped laser fluence to a level lower than would be achieved with a pure on-axis spacing.

Figure 11:
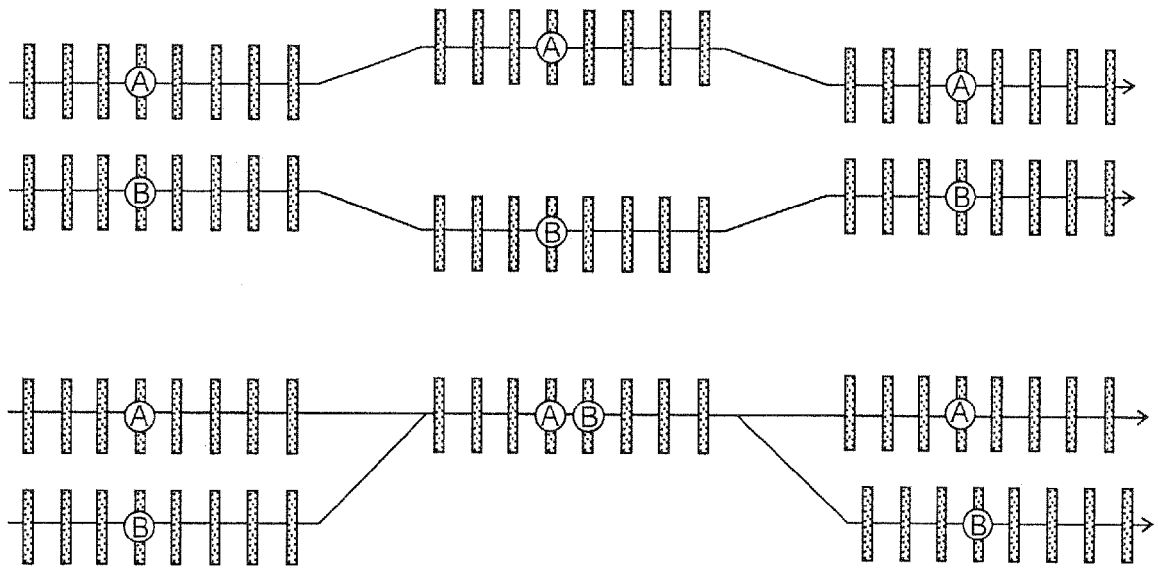
FIGS. 11 and 12 are illustrations of two laterally spaced laser spots with relative steering in the lateral direction, according to one embodiment.

Multi-beam link processing machines may also adjust the relative spacing of the laser spots during a link run for additional advantage. This may be done for calibration or compensation purposes, for example the relative positioning of two or more links to be simultaneously processed may not be uniform throughout the link run. Scale factors, rotations, and positional arrangements of the links may vary throughout the link run. Spot adjustment may also be done to compensate for detected errors. While adjustment of the beam spacing while processing banks of links is possible, the beam spacing can be most easily adjusted during a gap between banks of links in a link run. A few examples of shifting spots in both the on-axis and cross-axis while traversing a gap between banks of links are depicted in FIG. 11. An unlimited number of useful reconfigurations of beam spacing is easily envisioned in light of the teachings herein.

Shifting from processing using cross-axis spaced spots to on-axis spaced spots, possibly combined with an increase or alteration in the link run velocity, results in enhanced throughput in sections of the wafer where link banks have intermittent parallelism, as shown in the bottom portion of FIG. 11. Shifting from processing on-axis spaced spots to processing cross-axis spaced spots is also depicted in FIG. 11. Readily changing from any multiple-spot processing mode to any other multiple-spot processing mode is feasible and can be advantageous. A suitable joint velocity profile can be computed that accommodates processing the link run in these different processing modes.

Figure 12:
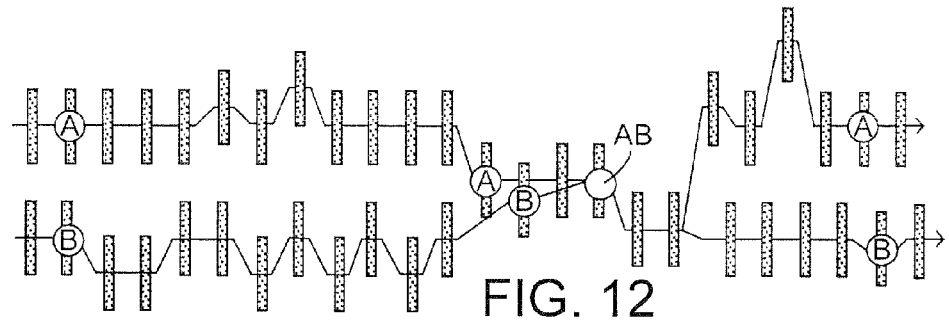

FIG. 12 depicts another way in which the relative spacing of two spots could be adjusted to process links. In FIG. 12, spots A and B are two spots processed at the same or nearly the same time, and the lines and arrows in the figure indicate their relative positioning and adjustment throughout the link run. A fast actuator, such as an AOM (acousto-optic modulator), can steer the beam(s) and thereby adjust the relative beam spacing before a link run or between subsequent links in a link run.

Although much of the above discussion has focused upon the creation of two-spot laser link processing systems, the principles and ideas may be further extended to systems that use three, four, or more focused laser spots. Such multiple spots may be configured with lateral spacings, on-axis spacings, and also both on-axis and cross-axis spacings.

Figure 13:
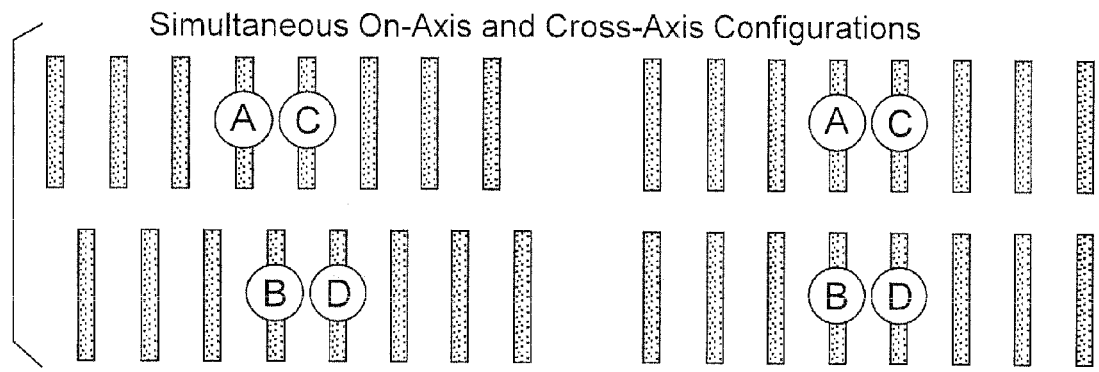
FIG. 13 is an illustration of two cases of a four-spot arrangement with both on-axis and cross-axis spacings, according to one embodiment.

Processing links using an arrangement of cross-axis spaced and on-axis spaced pulses offers many of the advantages of both on-axis and cross-axis spaced pulses. For example, the number of link runs can be reduced, dramatically improving throughput, and the link runs may be processed at much greater velocity. In FIG. 13, pulses A, B, C, and D all arrive substantially simultaneously at the links. As shown in the first example in FIG. 13 (shown on the left) below, the spots are not necessarily arranged in a grid. Configurations can be applied that elegantly match different device link layouts.

Processing numerous links in parallel with various on-axis and/or cross-axis focused spot configurations may require the consideration of more information in the generation of the link run trajectory and velocity profile. All link blow coordinates, spot locations, and large gaps between link banks must be considered. This increases the complexity of the computation of the link run velocity, gap profiling segments, and ramp-up and ramp-down distances.

VI. Multiple Beams on the Same Spot or Link

Another category of multiple laser spots arises when the spots are all directed to overlap at a single target structure. Two advantages of processing semiconductor link structures with overlapped spots are that (1) spots with different optical properties can be selectively chosen for link processing and (2) small time delays can be used for temporal pulse shaping or spatial spot shaping. Furthermore, using spots that only partially overlap on the same link can enhance the reliability of link severing without incurring a throughput penalty.

When starting with a single laser pulse, spots of different optical properties can be applied to a link by using additional optical elements to alter the properties of the multiple beam paths. Alternatively, different laser heads can provide laser spots of different optical properties that are subsequently combined to overlap. It should also be noted that adjustable steering mirrors or beam deflectors are not required to implement spots that overlap at the work surface. Fixed optical elements can be used.

When the multiple laser spots can be independently switched to reach or not reach a target link, the link can then be processed with any or all of the beams. As an example, a system with two optical paths could have one path with polarization aligned with the X-axis and the other path with a polarization aligned with the Y-axis. If it is desired to process a link with X-axis polarization, then the optical switch controlling the X-axis polarized beam allows the laser pulse to pass and the optical switch governing the transmissibility of the Y-axis beam is set to a blocking state. Alternatively, the link could be processed with a Y-axis polarization by passing just the Y-axis polarized spot. And, if desired, both optical switches could be opened to apply light of both polarizations to the link. This could be done to apply laser pulses that do not have a preferential polarization or have greater pulse energy to some links.

If it is desired to only process a link with one of the multiple spots resulting from independently switched, shuttered, or blocked laser beams, then processing may occur without overlapping the spots. In this special case, the multiple spots do not necessarily impinge upon the same spot or link. It is advantageous to not require the overlap because the precision with which the laser beam paths are aligned may be relaxed. In the case where the multiple spots do not impinge on the same spot or link, links are processed by using the positioning mechanism for adjusting position of the workpiece relative to the focused laser spots such that the desired spot impinges upon the target link. For example, it may be desirable to process an X-axis link run with one of multiple spots and a Y-axis link run with another of multiple spots. After performing a calibration procedure to determine how to target the desired links and link runs with each desired spot, the link runs may be successfully executed with their respective spots.

Many different optical properties can be altered by inserting additional optics into the beam paths of a multi-beam system. Inserted optics may be: (1) polarization altering elements to create or change the polarization state of an optical pulse; (2) attenuators to change the pulse energies; (3) beam-shaping optics to change the spatial distribution of the pulse (e.g., elliptical, gaussian, top-hat, or doughnut (a spot with less energy in the center) profiled spots); (4) frequency-multiplying optics to change the wavelength of a pulse (or different source lasers providing multiple pulses of different wavelengths); (5) beam expanders to create different focused spot sizes at the link; and (6) lenses and relay optics. Other optical properties that can differ between the multiple beam paths will be apparent to those skilled in the art, as will be the appropriate optics to create those optical properties.

A second use of multiple spots delivering energy to one link is temporal pulse shaping. Temporal pulse shaping can be accomplished by taking a laser pulse, splitting it into multiple beams that include time delay elements, and recombining the beams at a link structure. Through this technique, a pulse that has a fast rise time but a short duration can be effectively stretched to have a fast rise time and a long pulse duration. Delayed pulses may be attenuated or be created with beam splitters of varying ratios to offer additional flexibility in shaping the pulse amplitudes.

Figure 14:
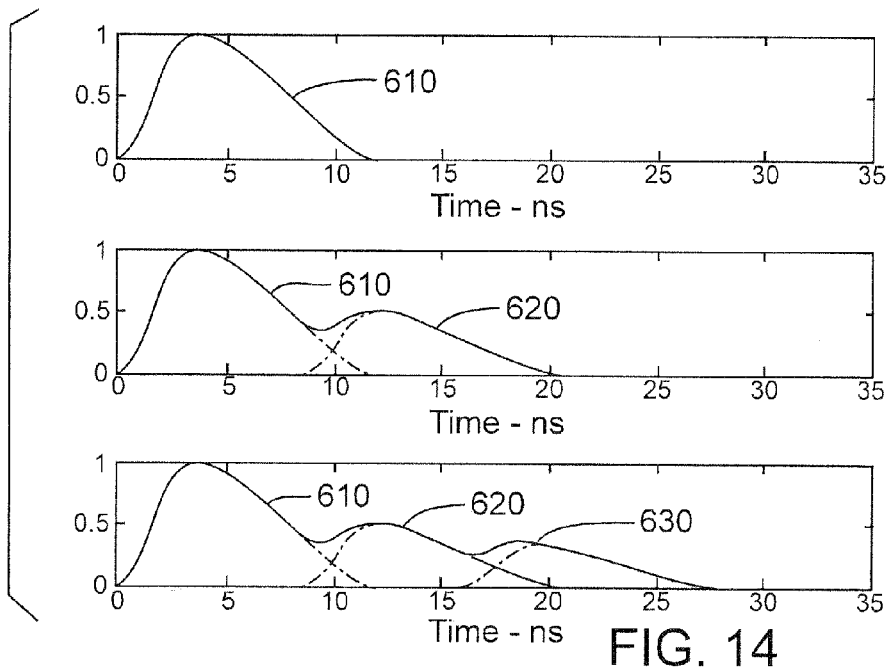
FIG. 14 is a set of plots of laser pulse power versus time, according to one embodiment.

FIG. 14 depicts a process of pulse shaping by combining delayed pulses. The top graph depicts a single laser pulse 610. The second graph depicts this same pulse 610 plus a second pulse 620 of lower amplitude that has been delayed by about 8 ns. The rise time is fast, and the effective pulse duration is longer. The third graph depicts the primary pulse 610 with the second pulse 620 and a third pulse 630, each of lower amplitude and with increasing delays. The resultant additive waveform creates a long pulse width of about 20 ns with the fast rise time of the original pulse. This pulse shape is desirable for processing some semiconductor link structures.

Delay can be added by introducing additional distance in an optical path. A delay of about 1 ns results from each foot of additional path length. Delay may result from, for example, simple beam routing, reflecting beams back and forth between mirrors, or dumping the beam into a length of fiber-optic cable.

Pulse shaping can also be achieved by combining laser pulses of different properties from two different laser sources. For example a short pulse with a quick rise time can be combined with a longer pulse of slow rise time to create a fast-rise, long-duration pulse.

Referring back to the partial overlap configuration 580 in FIG. 5, the two beam spots A and B partially overlap on the same link. In one preferred embodiment, the two spots are offset along the lengthwise direction of the link. That configuration can result in more reliable link severing, especially when the spot size is small, as a single small spot may not reliably sever a link. Rather than taking two passes with a single laser spot to blow the links a second time in order to ensure severance, the partial overlap configuration 580 can achieve the same reliability of severance without incurring a 50% throughput penalty.

As can be seen in FIG. 5, two laser beams propagate along respective distinct beam axes that intersect the same link at different locations offset from one another along the length of the link. Furthermore, the lasers subtend respective spots A and B on the surface of the link. The spots A and B are non-concentric and define an overlapping region formed by the intersection of both spots and a total region formed by the union of both spots. For example, the area of the overlapping region may be 50% of the area of the total region. The energy levels of the two laser beams is preferably set to ensure complete depthwise severance of the link across its entire width in at least some portion of the total region (most likely the overlapping region). The energy ratio of the two beams may be 1:1, but need not be so. Although the two laser beams may impinge upon the link at different times, any time delay is preferably sufficiently small (e.g., less than about 300 ns) to permit on-the-fly link severance as the laser beam axes scan along the bank of links. Note that the case of two partially overlapping spots can be generalized to three or more spots along the length of the link in a partially overlapping pattern.

Utilizing multiple spots in conjunction with multiple beams delivered to each spot is also a useful technique. For example, there could be three laterally spaced focused spots with two different beam paths being delivered to each spot. This may be done to combine the throughput benefits of multiple spots that do not overlap with the pulse creation and selection advantages of multiple spots focused upon a single location. Thus three spots could each use multiple beams for temporal pulse shaping, spatial pulse shaping, or having the ability to select beams with different polarization states.

VII. Implementations

Figure 15:
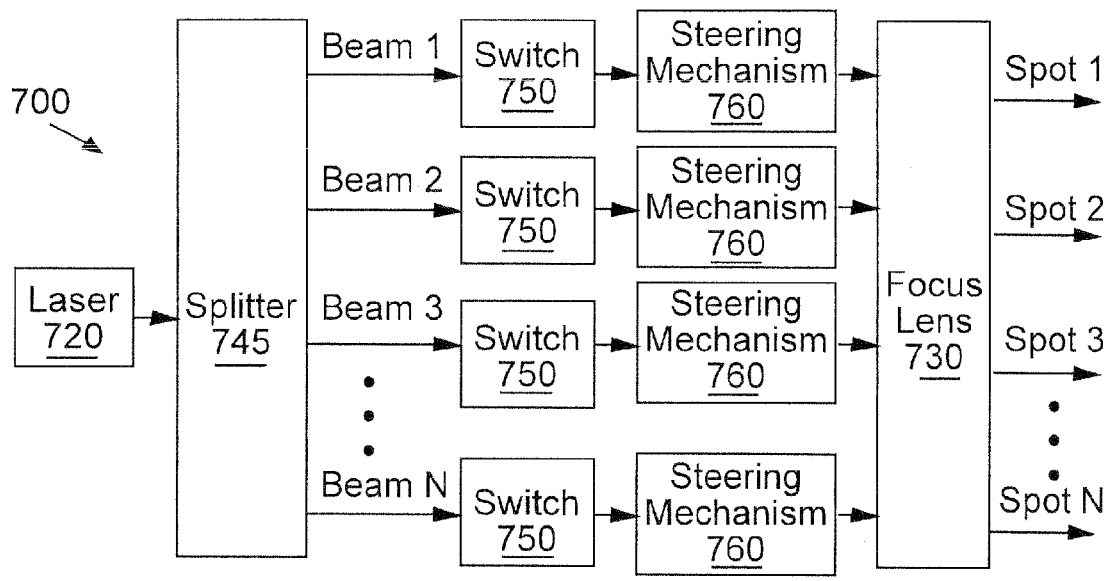
FIG. 15 is a block diagram of a multiple-spot laser processing system, according to one embodiment.

Parallelism can be accomplished using separate optical paths that are delivered to target links through either a single focusing lens or multiple focusing lenses. The separate optical paths may originate from a single laser or from multiple lasers. One implementation of parallelism results from one laser head and one focus lens, as the block diagram in FIG. 15 shows. FIG. 15 depicts the basic functionality of an N-spot link processing system 700 with one laser 720 and one focus lens 730. The laser beam output from the laser 720 is directed to a beam splitter 745, which splits the laser beam into N beams, labeled beam 1 through beam N. Each beam from the splitter 745 passes through a switch 750, which can selectively pass or block the beam. The output of the switch 750 goes to a beam steering mechanism 760, which may be fixed or adjustable. The beam steering mechanisms 760 direct the individual beams to the focus lens 730, which focuses the beams onto N-spots on the semiconductor device being processed (not shown). Although the beam steering mechanisms 760 are preferably dynamically adjustable, they may be fixed.

Figure 16:
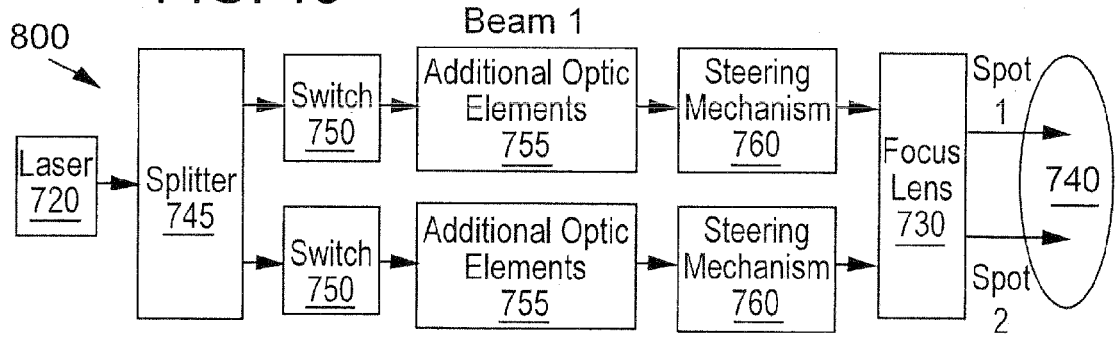
FIG. 16 is a block diagram of a two-spot laser processing system, according to one embodiment.

A special case of the N-spot system occurs when N=2. A block diagram of a two-spot laser processing system 800 is depicted in FIG. 16. The two-spot system 800 is like the N-spot system 700 but may contain additional optical elements 755, which are optional. The components of the N-spot system 700 and the two-spot system 800 may be implemented with bulk optics, integrated optics, or fiber optics, for example. The order of some of the elements in the block diagrams may be rearranged (e.g., the switch 750 may be located after the additional optical elements 755 in the beam paths).

Figure 17:
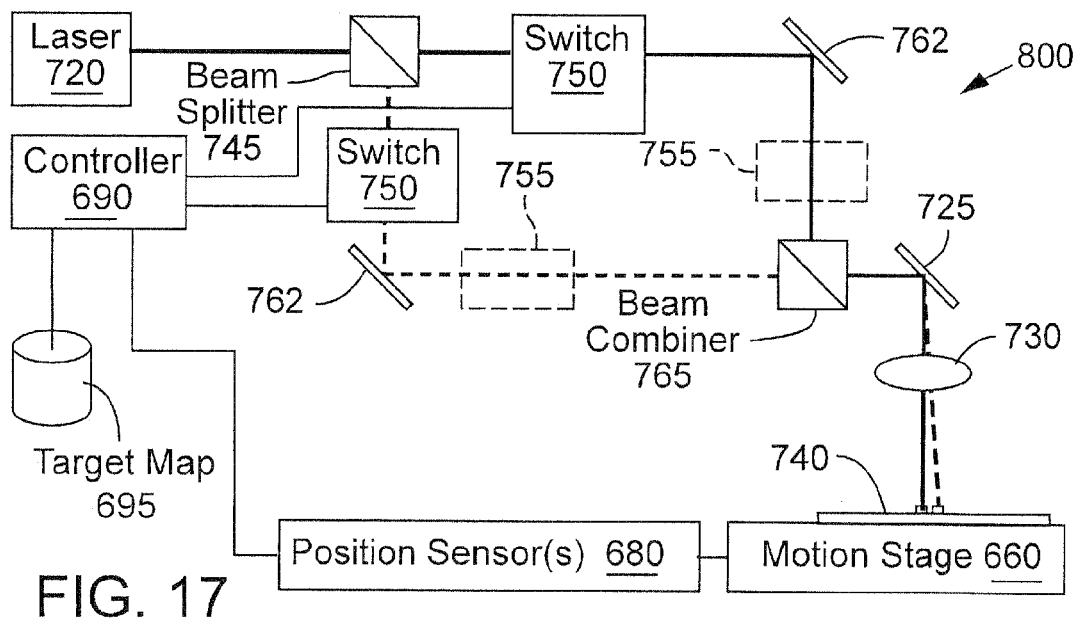
FIGS. 17-24 are diagrams of various implementations of a two-spot laser processing system, according to various embodiments.

FIG. 17 is a more detailed depiction of the principal components of one form of the two-spot laser processing system 800. With reference to FIG. 17, the two-spot system 800 operates as follows: The laser 720 is triggered to emit a pulse of light that is delivered to the beam splitter 745. The beam splitter 745 divides the pulse into two separate pulses that will independently be delivered to the work surface 740. One laser pulse, shown as the solid line, travels to the work surface 740 through a first, fixed optical path. The second laser pulse, shown as a dotted line, travels to the work surface 740 through a second, fixed optical path. Two switches 750, such as AOMs, are included so that either pulse may be passed to the work surface 740 or blocked. Each pulse is reflected off a mirror 762 and directed toward a beam combiner 765. The pulse are recombined in the beam combiner 765, reflected off a final mirror 725, and focused through a single focus lens 730 down to the work surface 740, where they impinge upon semiconductor links. Additional optic elements 755 may also be included in the beam path to change the optical properties of the pulses.

FIG. 17 also depicts components of the system 800 that control the relative movement of the workpiece 740 and the laser spots, the triggering of the laser 720, and control of the switches 750, according to one illustrative control architecture. In particular, the workpiece 740 is mounted to a motion stage 660 that moves the workpiece 740 in an XY plane (the laser beams being incident upon the workpiece in the Z direction). One or more position sensors 680 sense where the workpiece 740 is relative to one or both of the laser beam spots and reports that position data to a controller 690. The controller 690 also accesses a target map 695, which contains data indicating target positions on the workpiece 740 that should be irradiated (e.g., to sever a link at that position). The target map 695 is typically generated, for example, from a testing process that determines which circuit elements in the workpiece 740 are defective or otherwise require irradiation, as well as from layout data and possibly alignment data. The controller 690 choreographs the pulsing of the laser 720, the shuttering of the switches 750, and the moving of the motion stage 660 so that the laser beam spots traverses over each target and emit laser pulses that reaches the workpiece 740 at the targets. The two spots of this basic implementation may be applied to the work surface 740 with any desired relative XY spacing within the range of motion limits of the XY motion stage 660. The controller 690 preferably controls the system 800 based on position data, as that approach provides very accurate placement of link blows. U.S. Pat. No. 6,172,325, assigned to the assignee of the present invention and incorporated in its entirety herein by reference, describes laser pulse-on-position technology. Alternatively, the controller 690 can control the system 800 based on timing data. Although a control architecture (e.g., the motion stage 660, position sensor(s) 680, controller 690, and defect map 695) is shown in FIG. 17 for completeness, control architecture are omitted from many of the following drawings so as to not obscure the other components involved in the illustrated laser processing systems.

Figure 18:
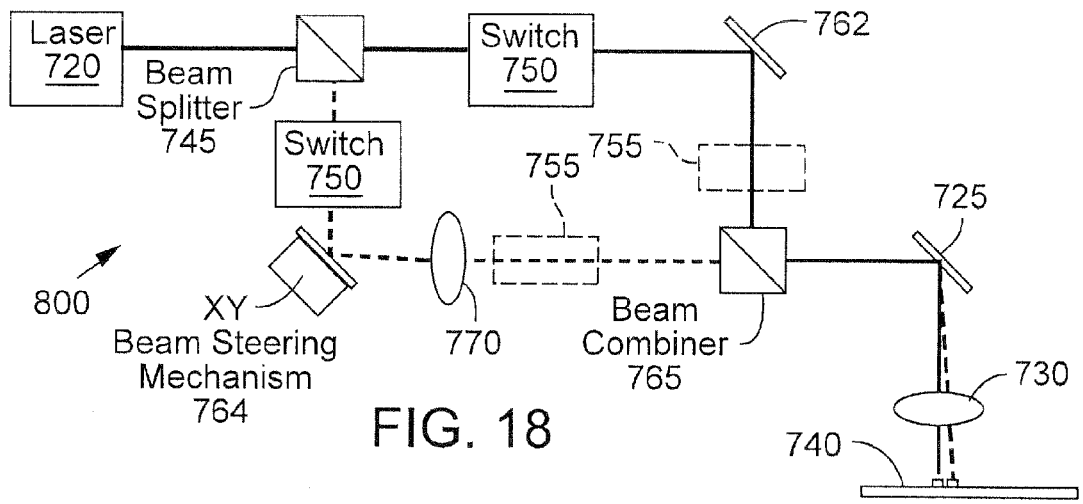
Figure 19:
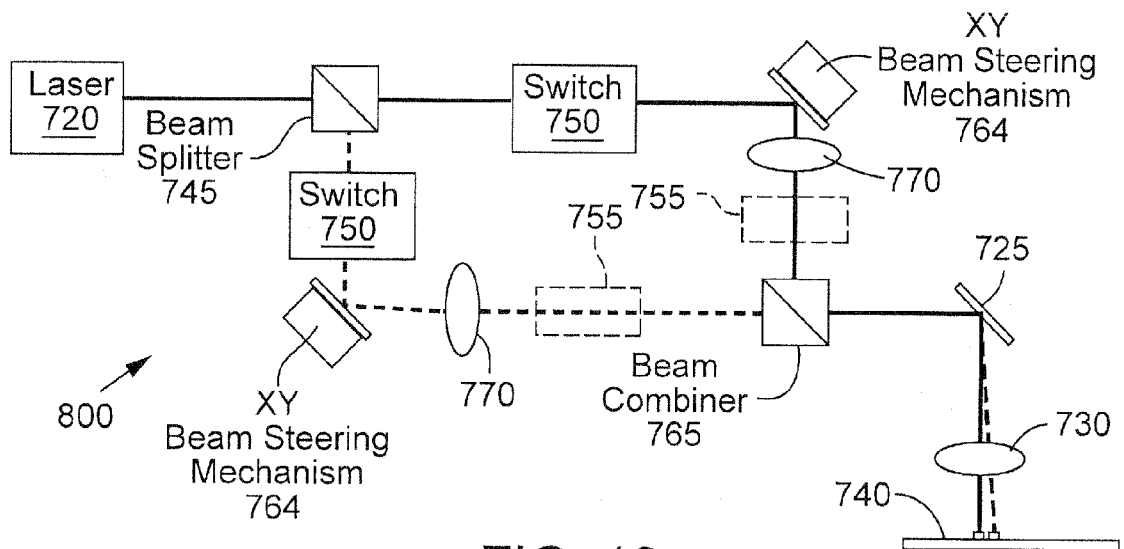
Figure 20:
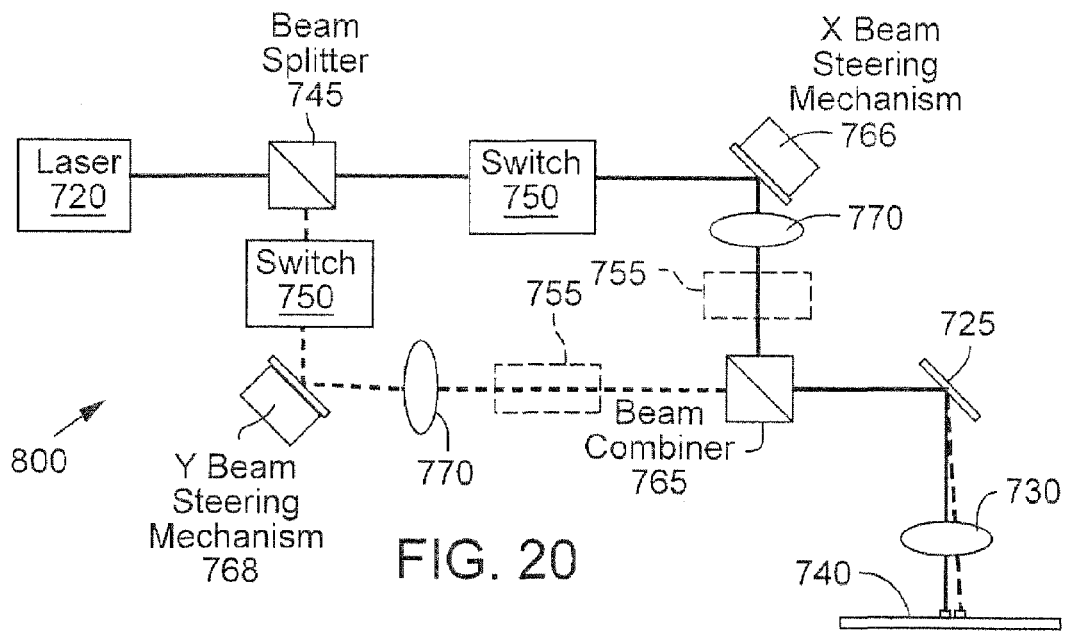

Many different configurations, some offering more advantage than others, are possible. First, one can provide adjustable steering of one beam in XY space, while the other beam is fixed, as illustrated in FIG. 18, in which the fixed mirror 762 in one beam path has been replaced with a dynamically adjustable XY beam steering mechanism 764, capable of steering the beam in both the X and Y directions, and a relay lens 770. In that case, one laser pulse, shown as the solid line, travels to the work surface 740 through a fixed optics path, while the second laser pulse, shown as a dotted line, contains an adjustable beam steering mechanism 764, such as a fast steering mirror, in the optics path so that the focused laser spot may be translated by a desired location in the XY plane of the workpiece 740. Second, one can provide steering of both beams independently in XY space, as shown in FIG. 19, which depicts XY beam steering mechanisms 764 in both optical paths. This potentially offers superior beam quality because smaller shifts of each beam can accomplish a larger offset. For example, if a 40 μm separation between the two beams is desired, then each beam can be shifted by only 20 μm in different directions. Smaller shifts result in less optical distortion and improved focused spot quality. Third, one can steer one beam in the X direction and the other beam in the Y direction, as shown in FIG. 20 which depicts an X beam steering mechanism 766 in one optical path and a Y beam steering mechanism 768 in the other optical path. Beam steering mechanisms in the laser beam propagation paths (e.g., the beam steering mechanisms 764) are preferably controlled by a control architecture (such as the one illustrated in FIG. 17).

In implementations employing a beam-steering mechanism 764, 766, or 768, such as in FIGS. 18-20, a relay lens 770 is useful. The relay lens 770 works in conjunction with a beam-steering mechanism to adjust the trajectory of the laser beam such that both beams strike the final mirror 725 at the same spot. The different spot locations of the two beams on the wafer 740 are attributable to the beams' different angles of incidence into the focus lens 730.

Figure 21:
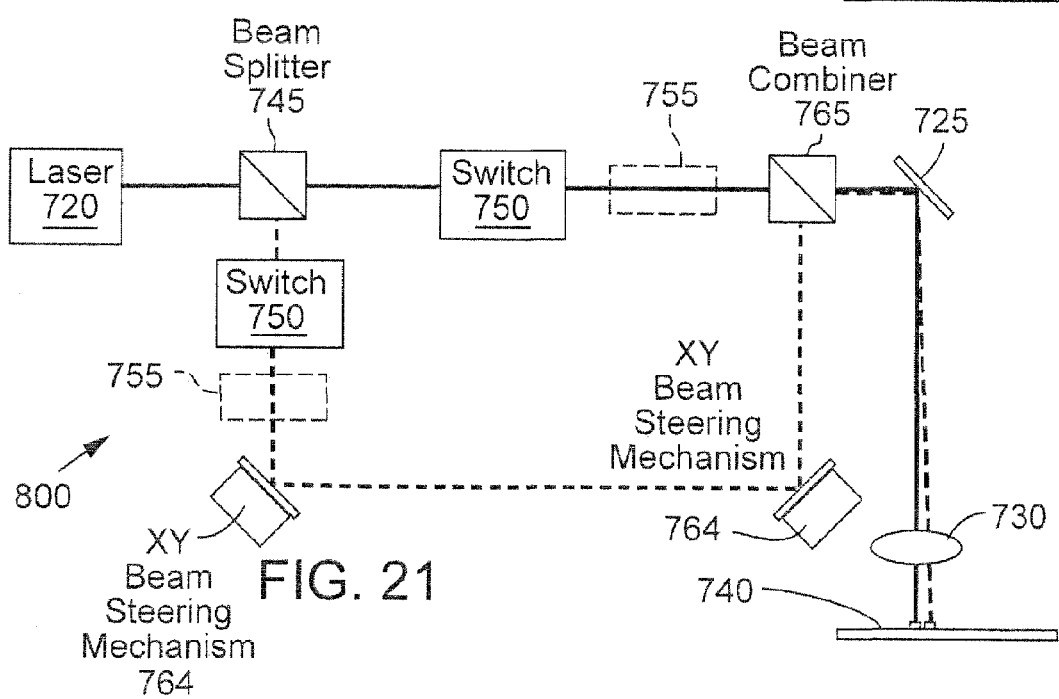

Physical implementations of each of these configurations may occur many ways. For example, a two-spot system depicted in FIG. 21 is an alternate configuration providing XY steering of one beam relative to the other beam. That implementation, which uses two steering XY beam mechanisms 764 rather than one with a relay optic 770, results in a system similar to the system depicted in FIG. 18.

Figure 22:
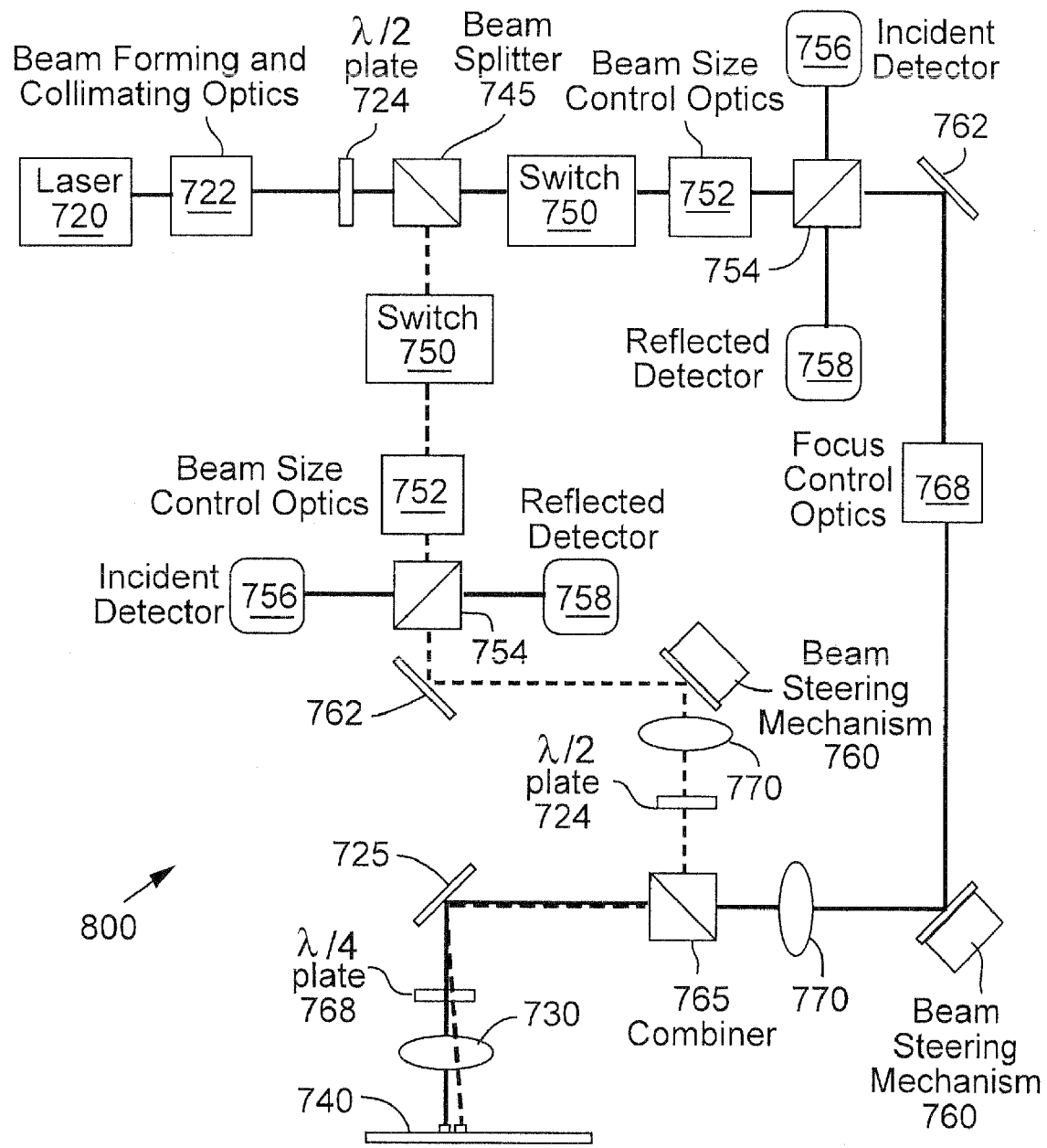

Another implementation of the two-spot system 800 is illustrated in FIG. 22, which shows a preferred embodiment in greater detail. In that embodiment, the output beam of the laser 720 is preferably linearly polarized. The beam goes through beam forming and collimating optics 722, which may change the beam size and more importantly produce a collimated beam, before reaching a half-wave plate 724 and a beam splitter 745. The beam splitter 745 is preferably a polarizer that splits the beam into two separate and orthogonally linearly polarized components A and B. Depending on the rotational orientation of the optic axis of the half-wave plate 724, the ratio of power in beams A and B can be adjusted continuously while the total power (A+B) is substantially preserved. For example, where it is desired that both focused spots on the work surface be identical, the optic axis angle of the half-wave plate 724 can be adjusted such that the two spots on the work surface have the same power despite variations in the power throughput between the two beam paths A and B.

Beam A out of the splitter 745 then goes through a switch 750, which is preferably a fast switching device such as an AOM. Depending on the desired switching speed or the construction of the AOM, beam forming optics (not shown) may be employed immediately before and after the AOM to facilitate suitable beam size and divergence inside the AOM. Alternatively, other fast switches such as an electro-optic modulator (EOM) can be employed. Obviously, the switch 750 can be omitted if independent control of the two beams is not desired, in which case both beams will be switched on or off at the same time.

Continuing down the optical path A, beam size control optics 752 can be employed to change the beam size such that the desired focused spot size is produced at the workpiece 740. For example, a programmable zoom beam expander (ZBE) can be implemented to vary the output beam size and therefore the final spot size at the work surface. Alternatively, other beam forming optics can be employed depending on the desired spot intensity profile and size.

In this embodiment, a suitable beam splitter 754 can be employed before or after the collimating optics 722 for power monitoring purposes. For example, in the incident path, a portion of the incident beam can be diverted to an incident detector 756 to monitor the magnitude and fluctuations in the energy of the laser pulses.

Optical signals reflecting off the features on the workpiece 740 can travel backwards along optical paths of the system. Beam splitter 754 can direct the reflected optical signals into reflected detector 758 for monitoring. Reflected and incident optical power levels are useful in calibrating the position of the focused spot, for example. During an alignment process, the focused spots are scanned over alignment marks on the work surface. Reflected power levels and position measurements are used to calibrate the position of the spot relative to the workpiece 740.

In the implementation depicted in FIG. 22, the polarizing optics cause the signals reflected off the workpiece 740 to travel back up the opposite path. Thus the reflections produced by the incident beam A to travel back up the solid beam path B. Likewise, the reflection from the incident beam path B will travel back up the dashed beam path A. This results in a crossing of the reflected signals. A preferred mode of operation when comparing incident and reflected signals is to use detectors coupled to opposite beam paths. Such comparisons may be useful for calibration and measurement purposes, such as determining the energy or properties of optical spots or performing alignment scans on the workpiece.

The next major component in the beam path A is a beam scanning or steering mechanism 760 that controls the focused spot location on the work surface. This is preferably a fast steering mirror that can move the spot in both X and Y directions on the work surface, although two scanning mirrors arranged in an orthogonal configuration can be employed, each scanning in one direction only. The one-mirror approach is preferred because it can produce angular changes in both axes of the beam while maintaining a stationary center of rotation at or near the mirror center. Alternatively, other scanning devices, such as AOMs, can be used for relatively small scan ranges but at high scan speeds.

In configurations with multiple scanning beams passing through a single focusing lens 730, it is desirable to place all beams at or near the center of the entrance pupil of the focusing lens 730 throughout the scanning range for optimum focused spot quality. This is especially true for focusing lenses of high numerical aperture (NA) and with input beam sizes that nearly fill the entrance pupil, as commonly encountered in link processing systems with spot sizes that are less than, for example, three times the beam wavelength. A common attribute of these high NA lenses is that the entrance pupil is located close to the lens, where it is very difficult, if not impossible, to fit physically all the beam scanning components. It is therefore advantageous to use relay lenses 770 that can reproduce the scanning angle from each distant scanning mechanisms into the entrance pupil. The relay lens 770, which may comprise multiple optical elements, is positioned between the steering mechanism 760 and the beam combiner 765 downstream. Positioning of the relay lens 770 affects performance, as the center of the steering mirror should be located at the center of the entrance pupil of the relay lens 770, while the exit pupil of the relay lens 770 coincides with the entrance pupil of the focusing lens 730. With this arrangement, the beam position at the entrance pupil of the focusing lens 730 remains substantially stationary over scan, thereby maintaining optimum beam quality of the focused spot throughout the scan range.

Another desirable property of the relay lens 770 is that the state of collimation of the beam through the lens be preserved. In the preferred embodiment, the beam size and the magnitude of the beam angle relative to the optical axis remain unchanged between the input and output of the relay lens 770. However, with a different design, the output beam from the relay lens 770 can have a different beam size and correspondingly different angle while maintaining the desired collimation. For example, doubling the beam size out of the relay lens 770 is likely to half the output beam angle. This arrangement may be useful in certain circumstance when it is desirable to reduce the scan angle range at the focusing lens 730 to enhance the positioning sensitivity of the spot on the work surface.

The relay lens 770 can be replaced by the addition of a scanning mirror or mirrors to the aforementioned optical train. With a minimum of two independent scan mirrors and by suitable manipulations of scan angles, it is possible to produce a scanning beam that is stationary at the entrance pupil of the focusing objective and with varying desired scan angles, thereby optimizing the spot quality throughout the scan-range. The disadvantage of such an arrangement is that the total mirror scan angles are greater than compared with the relay lens case; this can be a factor in fast-scanning, high-resolution mechanisms where the scan range is limited.

For the second beam path B out of the beam splitter 745, the optical train components can be substantially similar up to the beam combiner 765 if independent switching and scanning is desired. Optionally, a half-wave plate 724 may be employed if necessary to produce the desired polarization properties. In the preferred embodiment, the output beams from the two paths A and B with orthogonal polarizations are combined in a polarizer in such a way that the two output beams enter the entrance pupil of the focusing objective lens 730 at substantially the same location and direction when the scan mirrors are adjusted for overlapping spots on the work surface. The beam combiner 765 can be, for example, a cube polarizer or a thin-film plate polarizer, both of which are commonly available optical elements. This arrangement has the advantage of minimal power loss, although it is envisioned that other beam combiners such as diffractive optical elements or non-polarization sensitive splitters may be employed here. Moreover, the input beams to the combiner 765 may be non-linearly polarized.

After the beams are combined by the beam combiner 765, the mirror 725 directs the beams toward the focus lens 730. The mirror 725 may optionally be a scanning mirror or an FSM, inserted into the optical train for additional scanning. The center of scanning is preferably placed at the entrance pupil of the focusing lens 730, again for optimal focusing. This scanning mirror may be used for beam positioning error correction that is associated with the motion stages or other positioning error sources. This scanning mirror also may be used as an alternative beam positioning device to one of the beam steering mechanisms 760 for beams A or B. In that arrangement, the beam steering mechanism 760 of beam B may be eliminated, for example, and the motion of the scanning mechanism 760 of beam A in conjunction with the motion of the mirror 725 produces the desired spot positions at the work surface 740.

In most link processing applications, it is desirable to have focused spots of nearly identical size and intensity profile. By measuring the size of each spot and adjusting the beam size control optics 752 of the two beam paths, spots of nearly identical size can be created. Alternatively, the two beams can be recombined after the switches using a polarizer and the combined beam sent through common beam size control optics before they are split a second time. The use of common beam size control optics should ensure substantially identical focused spots at the work surface.

Intensity profile(s) can be controlled by the adjustment of half-wave plate 724, through drive signals delivered to optical switches 750, or through the use of optional additional attenuation optics.

In a multi-beam system, it may also be advantageous to have all beams focus simultaneously and exactly on the same plane (parfocality property) at or near the focal plane of the objective lens 730. Despite substantial similarity in the optical paths, normal tolerances in the optical components may prevent perfect parfocality. It is therefore desirable to introduce focus control optics 769 in each of the optical branches, although one of these can be omitted if the focus from that branch defines the focal plane. It is also possible to integrate this focus control function into the beam size control optics 752.

As the preceding examples illustrate, many different configurations and implementations of multiple-spot systems are possible. Variations can arise with different physical implementations such as bulk optic or fiber optic implementations, the types of optical components used (which are discussed in greater detail in another part of this document), the ordering of optical components, the number of laser pulse sources, and the desired configuration. Those skilled in the art will readily appreciate that a multitude of optical configurations can result in two-spot and multiple-spot laser processing systems.

A wide variety of optical components can be used to implement multiple spot laser processing systems. Described herein are many bulk optic component choices from which these systems can be constructed. Other options will be evident to those skilled in the art. The primary components pertinent to this invention are laser sources, beam splitters, beam switches, rotation generators, and beam altering optics.

The use of different lasers and different laser pulse properties in multi-beam laser processing may favorably improve the processing of semiconductor link structures. Many different types of laser sources may be employed or combined in multi-beam laser processing systems. These laser sources may include solid state lasers, such as diode-pumped q-switched solid state lasers, including lasers containing rare-earth-doped lasants such as $Nd:YVO_4$, $Nd:YLF$, and $Nd:YAG$ and vibronic lasants such as alexandrite, Cr:LiSAF, and Cr:LiCAF. The fundamental wavelength output of these lasers may be converted to harmonic wavelengths through the well-known process of nonlinear harmonic conversion.

These laser sources may further include diode-pumped mode-locked solid state lasers, such as, SESAM mode-locked $Nd:YVO_4$ lasers capable of producing pulsed picosecond laser output. Mode-locked solid state lasers may include oscillator-regenerative amplifier and oscillator-power amplifier configurations. The fundamental wavelength output of these lasers may be converted to harmonic wavelengths through the well-known process of nonlinear harmonic conversion. The laser sources may also include chirped pulse amplification laser systems for the generation of femtosecond (fs) laser output or may alternatively include other pulse stretching and compression optics well-known to the art for the purpose of generating pulsed femtosecond laser output.

These laser sources may further include pulsed rare earth-doped solid core fiber lasers and pulsed rare-earth-doped photonic crystal fiber lasers. Pulsed rare-earth-doped fiber lasers may include q-switched and oscillator-amplifier configurations. Further, a wide variety of oscillators may be employed, including broad area semiconductor lasers, single-frequency semiconductor lasers, light emitting diodes, q-switched solid state lasers, and fiber lasers. The fundamental wavelength output of these lasers may be converted to harmonic wavelengths through the well-known process of nonlinear harmonic conversion.

Additional laser sources may further include semiconductor lasers, gas lasers, including $CO_2$ and argon-ion lasers, and excimer lasers.

A wide range of wavelengths, from about 150 nm to about 11,000 nm, can be produced by the laser sources that can be included in multi-beam laser processing systems. Depending on the laser sources employed, pulsewidths ranging from 10 fs to greater than 1 μs and PRFs ranging from pulse-on-demand to greater than 100 MHz can be produced at the time of this writing. Depending on the laser sources employed, the pulse shape, energy per pulse or output power, pulsewidth, polarization, and/or wavelength may be tunable or selectable.

Laser sources with adequate energy per pulse output are desirable for multi-beam applications where the output from one laser source is split and delivered to multiple workpiece locations. Many lasers currently employed in link processing systems can produce adequate energy per pulse for multi-beam implementations due to the anticipated shrinkage in device structure feature sizes.

Ultra fast lasers, which deliver numerous pulses in rapid succession to process a link, are also applicable to multi-beam laser processing. In addition to use in the system like any other laser source, the generating and blocking of pulses in a system employing an ultra fast laser can be coordinated to allow different pulse sequences to be delivered down each of the multiple beam paths. For example, more or fewer pulses may be permitted to pass down one of the beam paths for delivery to a link. Pulses may also be delivered in bursts or delivered alternating down the different beam paths. An offset or adjustment in the laser spot location relative to the workpiece in one or more of the multiple beam paths can also be created by allowing a temporally different set of laser pulses to reach the target links.

Beam splitters may be bulk optics such as polarizing beam splitter cubes or partially reflecting mirrors. AOMs, EOMs, and switchable LCD polarizers may also be configured and driven to perform beam splitting. Alternatively, fiber optic couplers may serve as the beam splitter in fiber-optic implementations.

Optical components for switching beams to allow pulses to propagate to the work surface 740 or be blocked include: AOMs, EOMs, pockel cells, switchable LCD polarizers, mechanical shutters, and also high-speed beam deflectors such as steering mirrors.

Beam steering mechanisms are typically in the class of rotation generators. Mechanical rotators include steering mirrors that may be actuated with piezoelectric, electromagnetic, electrostrictive, or other actuators. Galvanometers, tilt wedges, and arrays of micromachines mirrors also fall into the category of mechanical beam deflectors. Other optical elements that can steer optical beams include AOMs and EOMs.

For some applications, it may be possible to implement multi-beam laser systems with fixed beam steering mechanisms instead of ones responsive to input commands. Fixed or manually adjustable optics can be used to configure a link processing system to operate with focused spots that have a relative position spacing that matches link spacings on particular workpieces 740. Such systems would benefit from having some fixed paths that are used on X-axis link runs and other fixed paths used for Y-axis link runs.

A wide assortment of additional beam-altering optics may be included in the optical paths. Similar and/or different elements may be used in different beam paths. These additional optic elements may include polarizers, polarization modifiers, faraday isolators, spatial beam profile modifiers, temporal beam profile modifiers, frequency shifters, frequency-multiplying optics, attenuators, pulse amplifiers, mode-selecting optics, beam expanders, lenses, and relay lenses. Additional optic elements may also include delay lines that can consist of extra optical path distance, folded optical paths, and fiber-optic delay lines.

Figure 23:
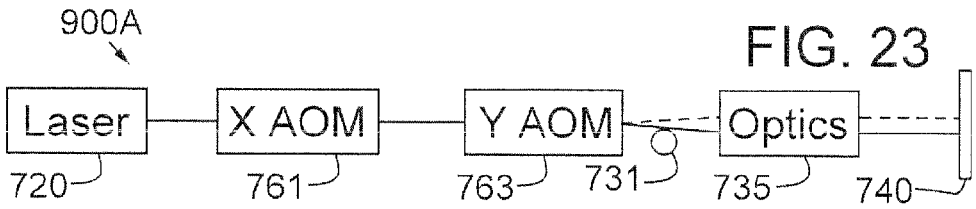
Figure 24:
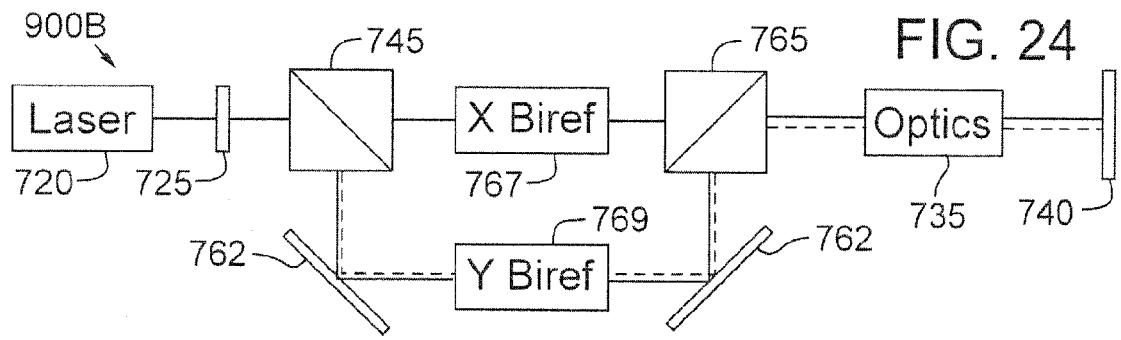

In the case of the full overlap configuration 570 or the partial overlap configuration 580 (FIG. 5), the implementation can be simplified. For example, FIGS. 23 and 24 are diagrams of systems 900A and 900B, respectively, producing the partial overlap configuration 580 of two laser spots. The system 900A comprises a laser 720 producing a laser beam having a series of pulses that pass through an X-axis AOM 761, a Y-axis AOM 763, and optics 735 before reaching a workpiece 740. The X-axis AOM 761 splits the laser beam incident at its input into two beams directed in different directions along the X-axis; the Y-axis AOM 763 does the same along the Y axis. Although typically only one of the AOMs 761 and 763 would be active at a given time (FIG. 23 shows the Y-axis AOM 763 active), having both in series allows the system 900A to operate on links having a lengthwise direction in either the Y or the X direction without having to reposition the workpiece 740. In place of the AOMs 761 and 763 any suitable beam-splitting device can be used. In the AOMs 761 and 763, the properties of the two output beams depend upon the characteristics of a radio frequency (RF) control signal (not shown). More specifically, the displacement between the two output beams is a function of the frequency of the RF signal, and the ratio of energies in the two output beams is a function of the power of the RF signal. That energy ratio preferably varies between zero and one. As an option, it is also possible to include a delay element 731, such as a fiber-optic loop, to delay one beam relative to the other. Finally, the optics 735 include such things as a final focusing lens and whatever other optical elements are desired.

The system 900B is an alternative implementation to produce two partially overlapping beam spots. The system 900B includes a wave plate 725 and a beam splitter 745, which splits a laser beam into two beams, which pass through respective diffractive elements 767 and 769. The diffractive element 767 splits the laser beam at its input into two beams directed in different directions along the X-axis, while the diffractive element 769 does similarly along the Y axis. Like the X-axis AOM 761 and the Y-axis AOM 763 in the system 900A, the birefrigent elements 767 and 769 provide flexibility to handle links extending in either the X or the Y direction. The outputs of the diffractive elements pass through a combiner 765 and optics 735 to reach the workpiece 740.

Figure 25:
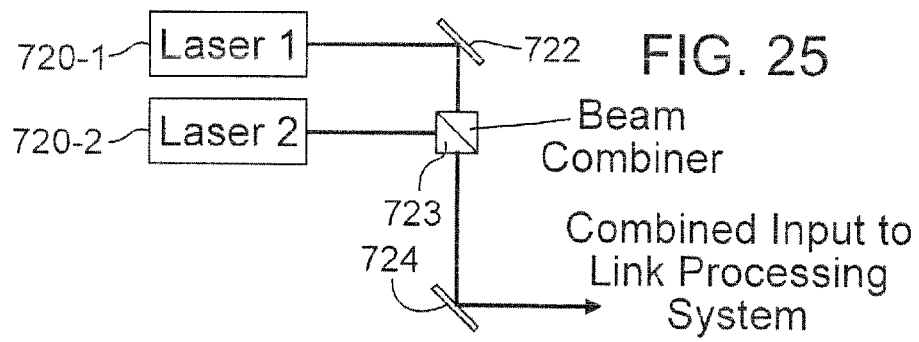
FIG. 25 is a diagram of a system for combining multiple laser beams, according to one embodiment.

Multiple laser sources may be used with multiple spot laser systems for greater flexibility and performance in the processing of laser links. Different configurations offer different advantages. For example, FIG. 25 shows one configuration utilizing multiple lasers 720-1 and 720-2, a first mirror 722, beam combiner 723, and a second mirror 724. In one mode of operation, the multi-laser configuration can be used to increase the effective laser repetition rate. By combining the multiple laser heads into a single output beam and sequentially triggering the laser heads to generate pulses, the effective laser repetition rate is increased. Since the effective laser repetition rate is increased without any increase in the repetition rates of the individual lasers, pulse properties are preserved. The pulse shape, pulse width, peak pulse height, and pulse energy can all be maintained. Increasing the laser repetition rate by driving a single laser at a high rate would increase pulse width and reduce available pulse energy. As an example of this technique, two 40 kHz lasers can be used to create a pulse train operating at 80 kHz with the same optical properties as a 40 kHz laser.

A multiple-laser configuration may also be operated to fire some or all of the lasers 720-1 and 720-2 simultaneously and have their output pulses combined to increase the available pulse energy.

A multiple-laser configuration may also be operated to create optical pulses with different optical properties that can be fired simultaneously or with small time delays for temporal pulse shaping. For example, pulses from a laser with a fast rise time may be combined with pulses from a laser with a long pulse width to create combined pulses that have a fast rise time and long pulse width.

Lasers of different wavelengths can also be combined in a similar manner. Multi-beam pulse shaping techniques previously described in this document can also be applied to these lasers to further tailor the input pulse train to a multi- or a single-beam link processing system. For example, a system equipped with lasers of IR and UV wavelengths could selectively use a pulse from either laser source to process links. Alternatively, the different laser heads could deliver pulses with different temporal shapes.

Combining continuous wave and pulsed lasers offers additional advantage in link processing systems. If the two beams overlap or have a known difference in focused spot locations, a continuous wave laser may be used for alignment and calibration and a pulsed laser may be used for link processing. Such an arrangement can take advantage of the fact that a continuous wave laser is better suited for alignment and calibration because it is always on and more stable than a typical pulsed laser.

Multiple laser heads may also be implemented where there are one or more laser heads that are delivered to a focused spot. This configuration may be repeated in a multiple-spot system such that each focused laser spot has a separate laser or lasers that provide pulses with which to process links.

The concepts described above can be generalized to many spots and many laser heads: Semiconductor link processing systems can beneficially be configured using an arrangement of M laser heads to produce N beam paths and K focused laser spots, where M, N, and K are integers greater than or equal to one.

As noted above, multiple lasers may fire at the same time and/or different times to combine or alternate between pulses. The lasers may be of the same or different optical properties. And laser pulse trains may be further divided and delivered to multiple link structures simultaneously or sequentially.

Figure 26:
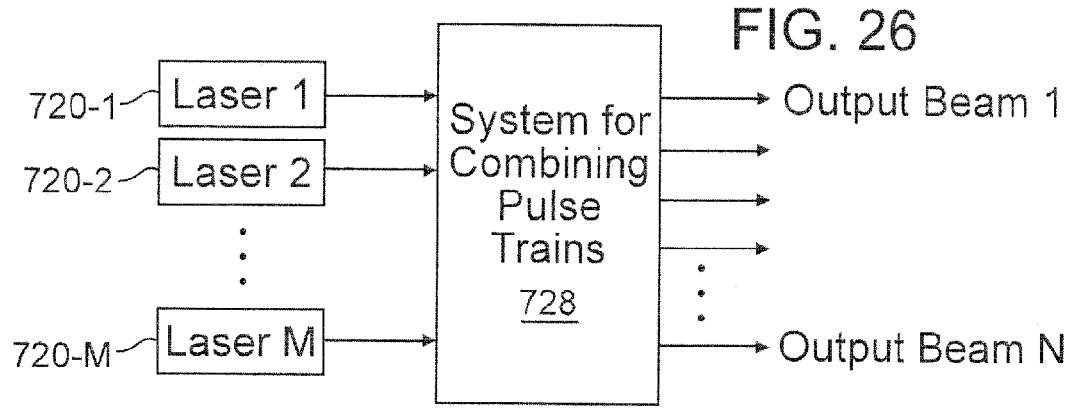
FIG. 26 is a diagram of a system for generating multiple laser beams, according to one embodiment.

FIG. 26 depicts an optical system that combines pulse trains from M input lasers into N output optical beams. That optical system can be created as a functional unit of a link processing machine.

Many of these functional optical system groups can be combined into one link processing system. The inputs to a beam combining optical system may be either laser heads or the output from another beam combining optical system. Similarly, the output from these optical subsystems may be delivered to focusing optics for processing semiconductor links, or may serve as the input to other beam combining optical subsystems.

The resulting mesh of laser heads that are interconnected through optical systems to multiple target links has great flexibility for (1) creating optical pulses with desired properties and (2) increasing system throughput by reducing the number of link runs required to process a product and increasing the link run velocity.

Implementation details presented above describe how to configure a system for producing multiple spots where all the focused beams emanate onto the workpiece 740 through a single focus lens 730. However, it is also possible to utilize multiple focus lenses. These multiple focus lenses can be arranged with an on-axis spacing, a cross-axis spacing, or both.

Multiple final focus lens systems can be created with numerous lens configurations. The system can contain two or more lenses along the on-axis of a link run and/or along the cross-axis of a link run. Lenses may be configured in a regular arrangement, a staggered arrangement, or a random arrangement. It is also possible to have an arrangement of lenses in a "+" plus configuration. A subset of the multiple focus lenses can be used for X-axis link runs and a different subset of lenses can be used for Y-axis link runs. The above mentioned lens configurations are a small subset of example configurations. Many other lens arrangements are possible, each with different advantages.

Implementing multiple lenses with a cross-axis spacing allows processing multiple link runs simultaneously. Thus, the number of times that the wafer must be passed underneath the focusing lenses is divided by the number of lenses. This can result in a dramatic throughput improvement. Additional advantages of laterally spaced spots were previously discussed in Section III and are applicable to multiple-lens systems.

Implementing two or more lenses in an on-axis configuration also provides throughput and hardware advantages. The on-axis spaced spot advantages previously discussed in Section IV, such as multi-blow, are applicable to multi-lens systems.

Spacing multiple lenses along the axis of link runs can also make each link run shorter. For example, two lenses spaced 150 mm apart will allow the processing a 300 mm wafer with link runs that are at most 150 mm long. Relative motion requirements to process a link run at the center of the wafer are the wafer diameter divided by the number of lenses.

With this processing method, link run velocity is unchanged from the single-spot case, however a dramatic time reduction results due to the shorter link runs. An additional benefit is that the travel range of the motion stages may be reduced. A smaller stage will reduce stage cost and footprint, and potentially increase the acceleration and bandwidth capabilities of the stage.

Due to the size of each focus lens, and the short focal length used in typical processing systems, it is likely that the focused spots in a multiple lens system would have a large (on the order of inches) separation at the workpiece. However, it is possible to create a multiple focus lens system that produces overlapping spots. Systems employing smaller lenses (e.g., UV lenses of 2-3 inches in diameter) may also accommodate more lenses than systems employing larger lenses (e.g., IR lenses of 3-5 inches in diameter) to achieve small spot sizes. For example, a UV system capable of processing 300 mm wafers may be able to employ up to about 6 lenses.

Figure 27:
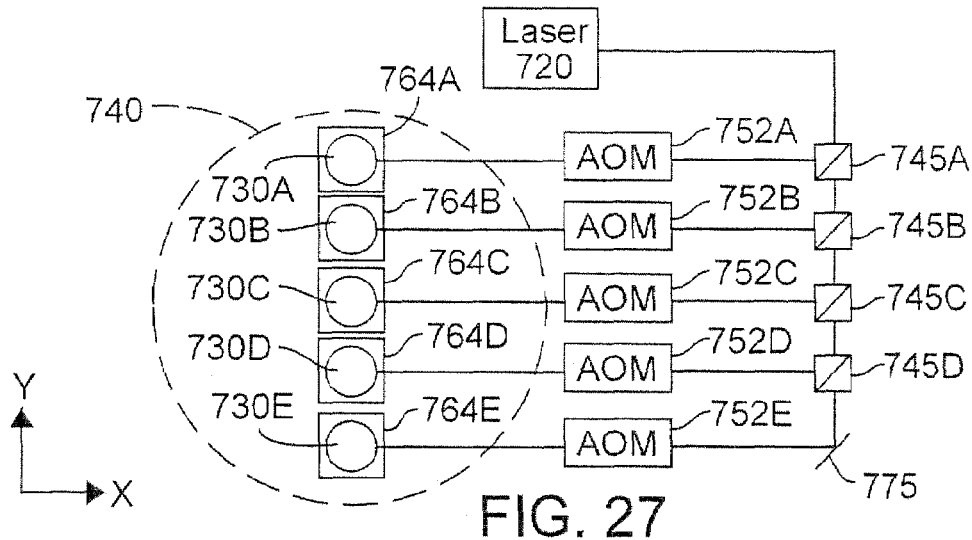
FIG. 27 is a diagram of a multiple-lens laser processing system, according to one embodiment.

FIG. 27 shows one implementation of a multiple lens semiconductor link processing system. Many alternative configurations are possible. Such a system can be positioned above the workpiece 740 (shown as a dashed line) that is on the XY motion stage 260 (not shown in FIG. 27) to perform link runs.

The multiple-lens system in FIG. 27 includes a single source laser 720 that produces a pulse train with beam splitters 745A-745D and a mirror 775 for delivering optical pulses to each focus lens 730A-730E. Optional steering mirrors 764A-764E or fixed mirrors are included before each focus lens. Independent AOMs 752A-752E or other switches are used to block pulses that are not meant to process links. Each lens 730A-730E also preferably has a focus mechanism and a fast steering mirror adjustment of the focused spot beam waist location.

In a multiple-lens system, it is advantageous to use an XY beam steering device such as an FSM or steering mirror before each focus lens to make small displacements of the focused spots to precisely position each focused spot at the desired target link. Use of the steering mirrors 764A-764E can correct for minor irregularity in the alignment or placement of each beam path and/or focus lens. These steering mirrors can also be used to compensate for (1) wafer rotation relative to the arrangement of lenses, (2) layout offsets, rotations, geometric irregularities, calibration factors, scale factors, and/or offsets that may differ across the wafer, and (3) dynamic or other errors that may have a different impact at each focused spot. In short, steering mirrors may help of any multiple-lens processing system to properly position all spots at the desired location on the workpiece at the correct instant which may require unique calibration parameters and/or compensation of each focused spot location.

The advantage of using multiple lenses may at times be limited by packing loss. Packing loss occurs because not every lens is always above a region on the workpiece 740 that requires processing. For example, referring to FIG. 27, when processing near the edge of the workpiece 740, the lenses 730A and 730E at the top and bottom of the figure may have their focused spots land off the workpiece 740. Because not all focused spots are usable in such a case, some inefficiency can result.

The asymmetrical configuration of lenses in the multiple-lens system of FIG. 27 (with alignment along the Y-axis) makes it natural to use an asymmetrical motion stage and different processing modality for X and Y link runs. The wafer 740 is moved about with a planar XY motion stage that has a long travel axis and a short travel axis. For example, 300 mm travel in the X direction is required, but only about 60 mm travel in Y is required. This contrasts with the motion stage in present single-lens systems where a 300 mm travel in both axes is provided. Reducing the travel requirements in the Y axis would reduce the motional mass and footprint of the stage.

Use of a motion stage with different X and Y performance characteristics that are matched with the X and Y processing modalities is desirable and offers additional advantages. One such motion stage is a stacked XY stage that has inherent properties well suited for use in the system of FIG. 27. In an implementation of stacked motion stages, the X-axis motion stage carries the Y-axis motion stage. In such a configuration, the X-axis motion stage typically has less acceleration and bandwidth because it carries the mass of the Y-axis motion stage, yet it may have an extended travel range. The lighter Y-axis motion stage can deliver greater acceleration and bandwidth. The Y stage mass can be further reduced if only a short travel range is required.

This combination of properties is well suited for use with the multiple-lens processing system of FIG. 27. A preferred configuration is to align the X-axis motion stage with the optics table such that cross-axis parallelism reduces the number of link runs. The Y-axis motion stage is aligned with the optics table for on-axis parallelism. The many shorter link runs in the Y-axis are processed with the higher performance Y stage, and the lower performing X-axis is used to process fewer link runs.

Because typical DRAM wafers are often asymmetrical in the number of link runs and link densities along each axis, there may be a preferred orientation of the workpiece 740 to a multi-beam processing system. Typical DRAM wafers have one processing axis with many more link runs and greater link density. The other axis has fewer link runs, but sparser links with more gap profiling opportunities. In that case, a desirable processing configuration orients the wafer such that the axis with many dense link runs is processed with the slower axis (the X-axis in the stacked stage described above) using cross-axis parallelism. This reduces the required number of link runs. Because there is less opportunity for gap profiling in that direction, due to link density, the lower performance motion stage in that direction is appropriate. The faster axis is then used to process the sparse link runs and it can take advantage of on-axis parallelism to quickly process many link runs with more opportunities to benefit from gap profiling.

An alternative way to use the multi-lens system in FIG. 27 is to process all link runs as either X- or Y-axis link runs. This takes advantages of the on-axis or cross-axis advantages of multiple lenses in either configuration. In order to process all the link runs as either X or Y axis link runs, it would be necessary to rotate the wafer. This can be accomplished by designing a rotation mechanism into the chuck or by removing the wafer from the chuck, rotating it with a rotating mechanism, and then reloading the wafer onto the chuck surface. To reduce the time required to rotate the wafer, one can include a mechanism in the system that can remove a wafer from the chuck and quickly place a different wafer on the chuck. While one wafer is being processed, the other wafer can be rotated.

One advantage of processing all link runs in the same direction is that the motion stage can be optimized to process in that orientation. For example, if all link runs are done as short Y-axis runs, the Y axis can be optimized for high acceleration and bandwidth and low mass. In that case, however the X-axis requirements can be relaxed in comparison to present systems since it need only laterally advance between link runs and make small motions for X alignment scans. High accuracy may still be required in the X axis, however high speed and acceleration may not be as important.

Semiconductor ICs are typically fabricated as a regular grid of nominally identical rectangular die disposed upon the wafer. All of these die contain the same arrangements of links and link banks, and therefore may be processed with a similar pattern of link runs. However, the specific fuses to be severed on each die are the result of a testing process and therefore usually differ. The regular arrangement of identical die on wafers motivates a preferred arrangement of lenses in a multiple-lens processing system. It is natural and desirable to adjust the focus lens and moreover the focused spot spacing to be integer multiples of the die dimensions. Of course, small correction factors may need to be applied using a beam steering mechanism to account for calibration, scaling, and orientation differences such as minor rotations of the wafer. Spacing the lenses and/or focused spots in this manner allows each spot to simultaneously impinge upon the same corresponding links and link banks of different die. Processing two more die at the same time and processing the same corresponding links on two or more die at the same time using a multi-beam system are preferred modes of operation.

For example, suppose that each die has four link runs of types A, B, C, and D that need to be processed in the X direction. By adjusting the relative spacings between focused spots so that all lenses are processing the same links in link runs of type A at one time, then simply adjusting the wafer location in the cross-axis direction using the XY stage allows processing of all of the type B link runs simultaneously. One advantage of this technique is that coarse lens and focused spot locations can be adjusted once for each link run direction. Adjustment between link runs to ensure that all focused spots would be able to fall upon links is unnecessary. A second advantage of this technique is that it is much easier to produce a joint velocity profile, and there will be more opportunities for gap profiling. This arises because profitable gaps may occur in the same location of a type of link run on each die. Triggering the laser with purely cross-axis spacings is also easier because focused laser spots hit the same corresponding link on multiple die at the same time.

It may also be desirable for the lens spacing to match an integer multiple of the wafer mask size (focused mask size). This allows for die that are patterned on the wafer in one patterning step to all be processed by the same lens. Small step and repeat errors that occurred during the mask steps can then be calibrated out more easily.

A multiple-lens system that simultaneously processes multiple different die may have fewer opportunities for gap profiling in comparison with the single-lens systems. Single-lens systems have an opportunity to save time by gap profiling whenever it is unnecessary to process links on a die because they are unrepairable or perfect. Since multiple different die may be simultaneously processed with a multiple-lens system, there will be opportunities to skip over a complete die. However, the time saved by using multiple spots will be greater than the time lost due to less gap profiling. One advantage of a fast system that uses less gap profiling is that less heat is generated by the motion stage. The motion stage specifications may even be relaxed resulting in a lower cost, a more easily produced system, and a more compact system.

In a multiple-lens processing system, it is desirable to include a mechanism by which the spacing of lenses can be adjusted by several millimeters. This allows the lens spacing to be adjusted to match integer multiples of the dimensions of die on different customer products. Perfect placement of the focus lenses is not required as a beam steering mirror, such as a FSM (fast steering mirror) can fine tune the spot locations once the lenses have been mechanically adjusted.

A final aspect of multiple focus lens systems is that it is possible to produce multiple spots that emanate from each of the focus lenses. By doing so, link run velocity can be further increased and/or the number of required link runs can be further reduced, hence system throughput is further improved. The aforementioned advantages of multiple spots from a single focus lens can be applied to multiple spots from multiple focus lenses. These combined advantages are possible with on-axis and/or cross-axis spaced focused lenses, each delivering on-axis and/or cross-axis focused spots to the workpiece.

Other important aspects of multiple-spot processing are the software methodologies for determining links to be processed in parallel, the joint velocity profile, and conveying link run data to the computers or circuitry controlling the hardware.

For multiple-spot link runs where a nominally fixed offsets exists between the spots, it is not necessary to transmit all of the link coordinates that are to be processed for each spot. It is suffice to designate a "master spot" and convey, from the system control computer that designates link runs to the hardware controlling computer, the offsets of other spots relative to the master spot. Then the 'master link' coordinates to be processed by the master spot can be conveyed along with one data bit for each spot designating if the switch 750 for each beam should transmit or block pulses corresponding to each master link. This would dramatically reduce the amount of data that needs to be transmitted. Only one bit of information would need to be transmitted for each additional spot to be processed instead of link coordinates, each of which is a multiple byte number.

VIII. Error Correction

Figure 28:
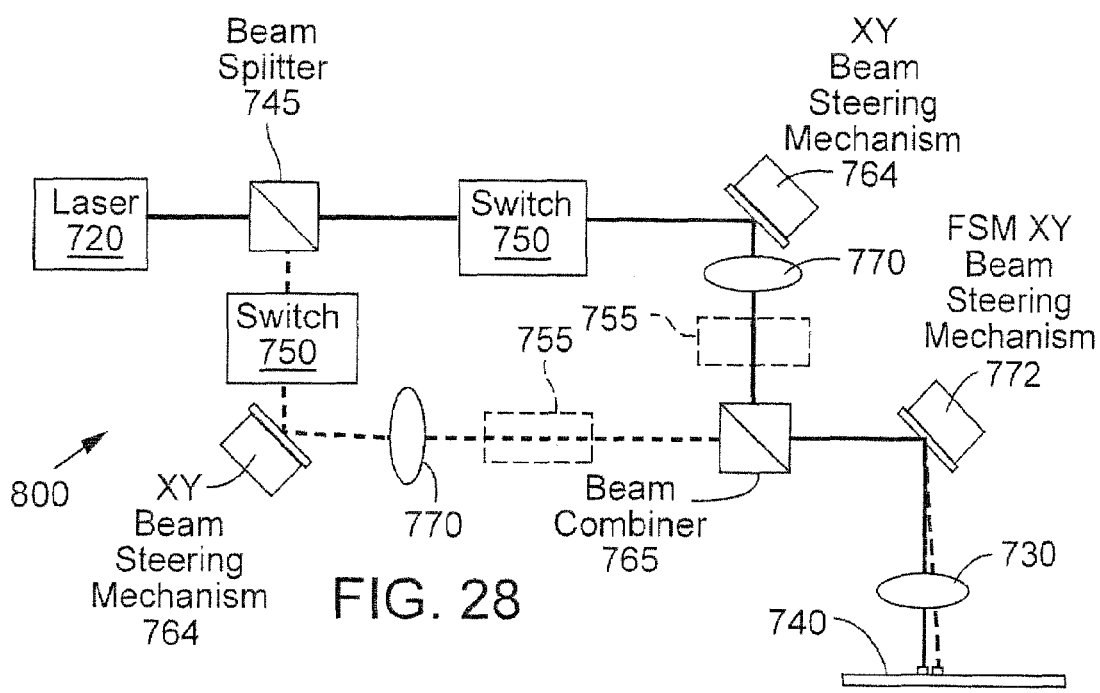
FIG. 28 is a diagram of a two-spot laser processing system with error correction capability, according to one embodiment.

U.S. Pat. No. 6,816,294 describes the use of a FSM to shift the position of a focused laser spot to correct for relative positioning errors that occur in an XY motion stage. The art described in that patent is fully compatible with the multiple laser beam processing systems described herein. As described therein, a laser beam is directed toward a target location on a workpiece in response to a coordinate position command. In response to that command, the XY motion stage positions the laser beam over the coordinate position on the workpiece. The system also senses the actual position of the workpiece relative to the coordinate position and produces an error signal indicative of the position difference, if any. A servo control system associated with the XY motion stage produces a position correction signal to compensate for the difference, thereby more accurately directing the laser beam to the target location. A similar servo control system can be utilized to direct multiple laser beams to multiple target locations. For example, in a two-spot system, the relative positioning errors due to XY motion stage error will impact both spots equally, and the inclusion of a final XY beam steering mechanism 772 may be used to redirect and correct those errors for the multiple-spot case, as shown in FIG. 28. Errors caused by XY stage rotation will not impact both spots equally, however any sensed rotation errors can be corrected in a similar manner using a rotation coordinate transformation and the two beam steering mechanisms 764.

Moreover, a system configured with steering mechanisms on one or more beam paths and also a final steering mirror offers additional flexibility for commanding spot motion and correcting errors. All of the XY beam steering mechanisms and any final FSM beam steering mechanism may be collectively used to impart desirable motion of the spots. For example, the final XY beam steering mechanism could move both spots by +20 μm in the X direction, and then the independent beam steering mechanism could move one spot by +20 μm in the X direction and one spot by −20 μm in the X direction. The resulting configuration has one spot that is unchanged from the initial position, the other spot displaced by +40 μm, and no actuator imparting more than 20 μm of motion. One advantage of such a configuration is that the amount of displacement imparted by any beam steering mechanism can be reduced. Furthermore, in concert with generating spot offsets, all the beam steering mechanisms can also work together to compensate for errors.

An additional advantage of the above configuration arises when the actuators have different performance specifications. For example, some actuators may have large travel range but limited bandwidth. Other actuators may have very high bandwidth but limited range of travel. Selectively allocating the frequency content and range of the desired beam steering commands to match the different actuators can result in a system that has a large travel range and also fast response necessary for error correction and command offset. Placing the beam steering mechanisms that will impart larger position offsets near the entrance pupil of the focusing lens, and those that impart smaller offsets further from the focusing lens can also result in less distortion of the focused spots.

With some optical configurations, an additional FSM XY beam steering mechanism may be unnecessary for correcting XY stage error. For example, if both beams have steering mechanisms allowing them to shift in both X and Y directions (e.g., as shown in FIG. 19), and if these steering mechanisms have sufficient bandwidth and range to correct stage error, then a final output FSM for error correction is redundant. The steering mechanism commands used to shift the two spots relative to one another can be combined with the commands necessary for error correction. The resultant steering mirror motions correctly position the spots relative to one another at the wafer surface and also correct for relative positioning errors.

Having independent steering mirrors for the two beams additionally allows for the correction of errors or calibration and scale factors that impact the ability to position each spot and the desired target locations. For example, wafer fabrication errors may cause slightly different scale factors or rotations of different die on the wafer, and beam steering can correct for these differences. Alternatively, optic-table resonances, optic vibrations, thermal drift of optic components, or other changes in the system could cause different relative positioning errors between each focused spot and target link structures on the workpiece 740. Independently driven steering mirrors coupled to sensors that detect position errors can make independent corrections to the different beam paths. Such position sensors could be optical encoders, interferometers, strain gauge sensors, inductive position sensors, capacitive position sensors, linear variable displacement transformers (LVDTs), position sensitive detectors (PSDs), sensors or quad photodetectors to monitor beam motion, or other sensors. Thus, using two steering mirrors provides more flexibility and benefit than a single steering mirror for error correction and calibration.

Other sources of positioning errors not noted in the above-referenced patent application can also be corrected using steering mirrors. For example, the pointing stability of the laser, AOM switches, and components in the laser rail can be detected using optical or mechanical sensors, and corrective action taken by the system's steering mirrors.

Figure 29:
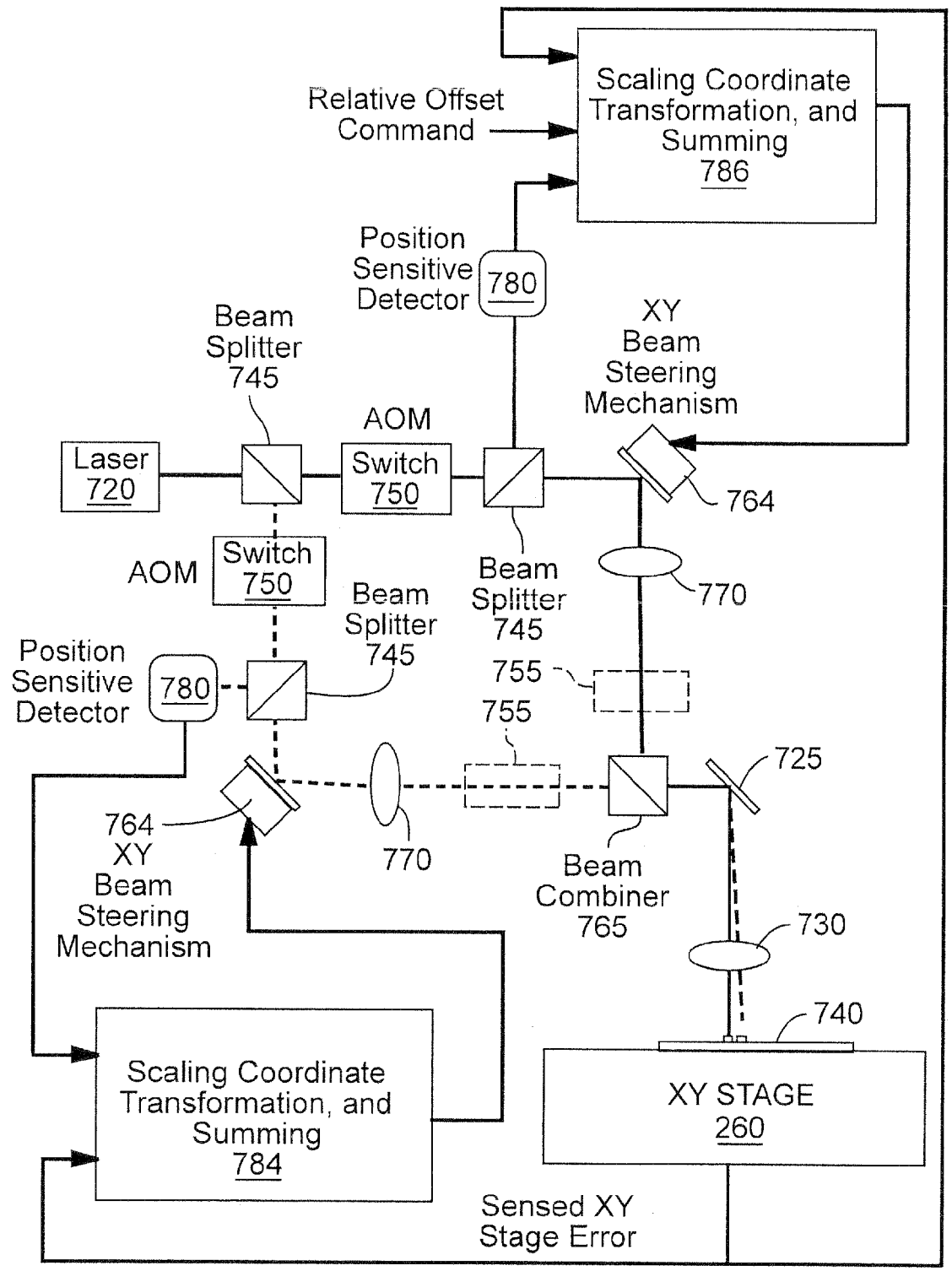
FIG. 29 is a diagram of a two-spot laser processing system with independent beam steering, according to one embodiment.

FIG. 29 shows an example of using the independent XY beam steering mechanisms 764 to: (1) create offsets of one focused spot relative to the other focused spot using relative offset commands; (2) correct for positioning errors of the focused spot relative to the workpiece detected in an XY stage servo system 784; and (3) correct for additional relative positioning errors detected with other position sensors. In this figure, PSDs 780 are used to measure beam motions resulting from laser pointing stability, AOM pointing stability, and mounting of optics. The errors measured in each beam path due to AOM pointing stability and motion of optical elements may be different in each beam path, so the figure depicts independent measurement, signal processing, and commands being delivered to the XY beam steering mechanisms 764.

It should be noted that beam steering mechanisms may preferably be adjusted before the start of link runs and also during the performance of link runs to create and maintain the desired relationship betweens between focused spot locations and target link locations. For example, these adjustments may compensate for system errors and also different coordinate systems, calibration parameters, scale factors, and offsets that may apply to links in different locations about the wafer.

The separation distance between the spots in a multiple spot processing system may also require more accurate wafer positioning. This need arises due to abbé offset errors, which are translational positioning errors attributable to small angular offsets over a significant lever arm. Single spot machines only require that the focused beam impinge upon the correct point on the workpiece when a laser pulse is triggered. This can be achieved with pure XY translation of the workpiece relative to the focused spot, even if the workpiece has small rotation errors. Multiple spot machines require that all spots impinge upon the proper locations of the workpiece simultaneously. For a fixed configuration of spots, small rotation errors will prevent all spots from simultaneously impinging upon the correct workpiece locations. This is particularly true of multiple lens implementations where the spot separation is larger, however it applies to single-lens implementations as well. Control, and in particular feedback control, of the workpiece relative to the multiple focused spots in more than two degrees of freedom is more important in multiple-spot processing systems than in single-spot processing systems. This control is relevant to planar motion involving X, Y, and theta (yaw) coordinates of the chuck and wafer, as well as full three-dimensional control further involving Z, pitch, and roll.

Sensing mechanisms may be useful to control and correct for errors including abbé offset errors in multiple spot systems. For example, putting an interferometer or other sensors in line with each lens in a multiple lens system can be a useful technique for error reduction because the positioning error near each lens can be detected. Furthermore, a central processor or FPGA can be employed to combine data from many sensors and to determine the geometric relationships between different system components such as: focused spot locations, steering mirror positions, beam path position, lenses, chuck, links etc. Having determined error between desired and measured the geometric relationships between components, positioning errors can then be mitigated. This may be through multi-dimensional control of the workpiece, chuck, stage, or other system components. Errors can also be compensated for using one or more FSMs to move the spots in the on-axis and cross-axis direction.

The geometric relationship between components is also useful for laser triggering. If one laser is used to generate multiple spots, either through one lens or multiple lenses, the system can trigger laser emissions based upon position estimates or measurements such that one or more spots will impinge upon the workpiece at the desired location(s). Triggering the laser at the estimated position(s) or time(s) that minimizes the average error between each of the multiple focused spot locations and the desired blow locations is one preferred pulse triggering method. Similarly, if multiple lasers are used to generate multiple spots, each laser can be triggered at the time(s) or position(s) that minimizes the error between the focused spot location and the target workpiece location. Other pulse triggering methods may also be implemented.

IX. Calibration, Alignment, and Focusing

Figure 30:
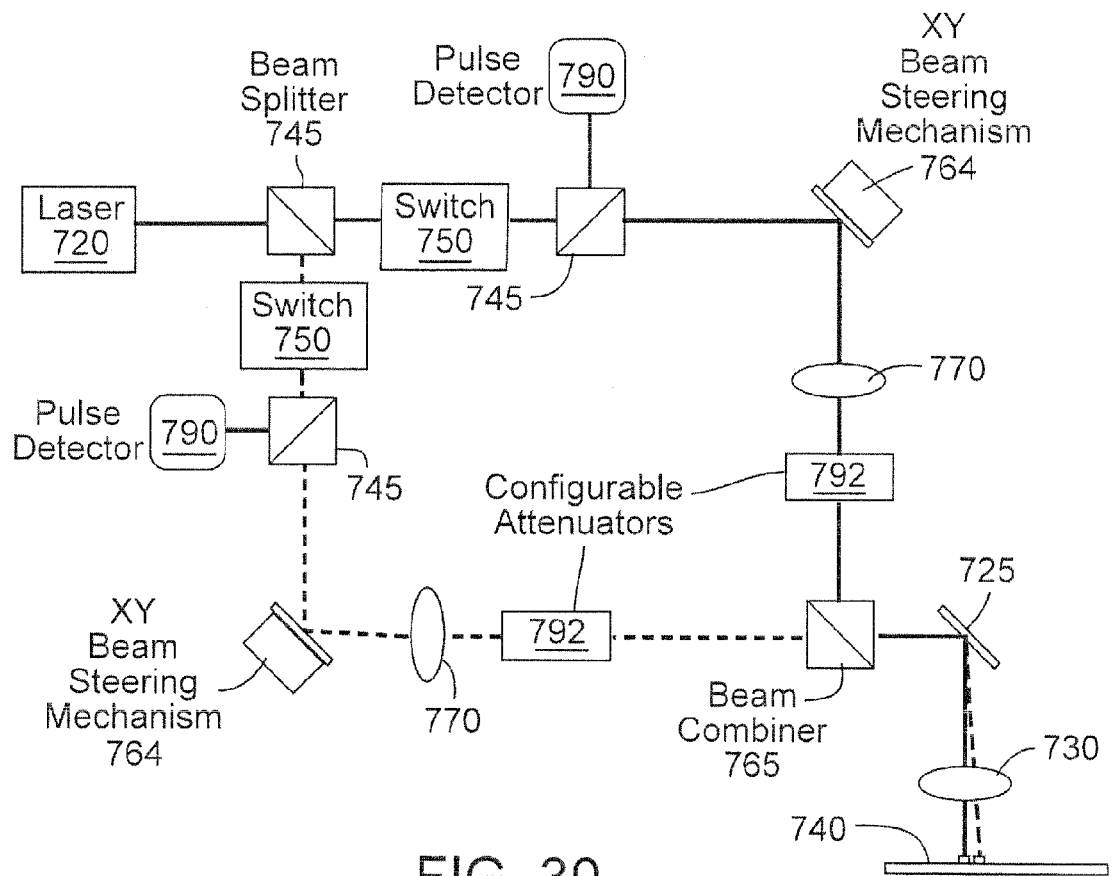
FIG. 30 is a diagram of a two-spot laser processing system with energy calibration capability, according to one embodiment.

Use of multi-beam path link processing systems can require calibration of the beam energy parameters and spot position parameters for each laser beam. One way to accomplish energy calibration, as shown in FIG. 30, is to tap off some optical power from each beam and use independent pulse detectors 790 to sense pulse properties, such as pulse energy, pulse height, pulse width and possibly others. Having sensed the optical parameter(s), configurable hardware in the beam path or laser can be used to make adjustments. In one implementation, information from the pulse detectors 790 can allow the independent tuning of configurable attenuators 792 in each beam path for energy control. The attenuators 792 may be standard optics, AOMs or other attenuators. Feedback from the pulse detectors 790 can also be used to modify the generation of the pulse in the laser. This offers additional advantage when multiple laser sources are used.

Figure 31:
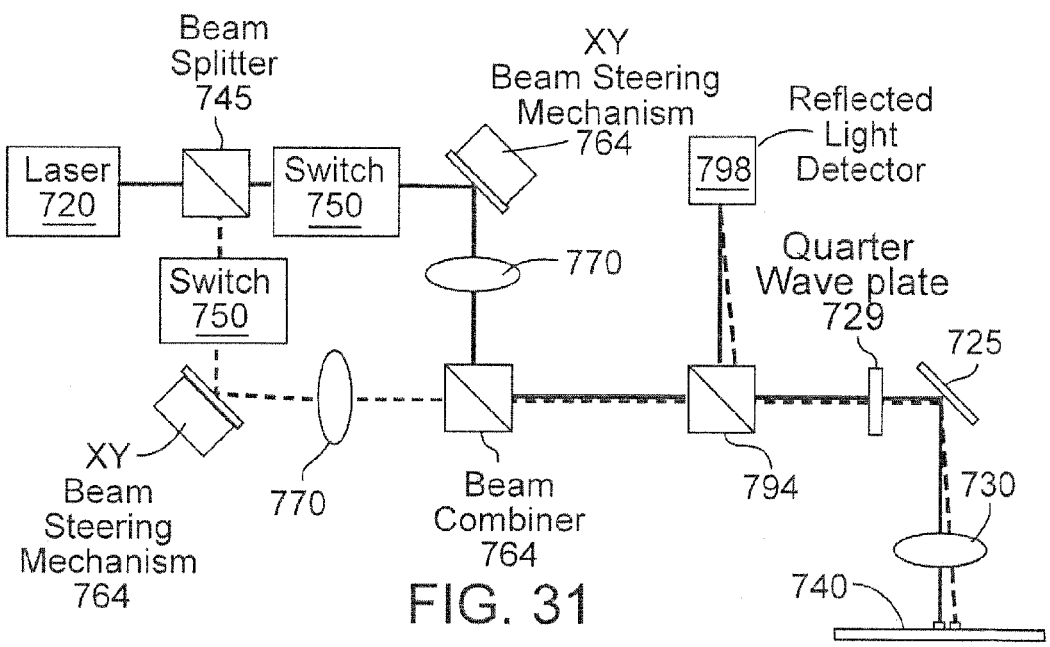
FIG. 31 is a diagram of a two-spot laser processing system with position calibration capability, according to one embodiment.

Performing system position calibration with multiple laser spots is similar to present single-spot calibration. However, the Z-height relationship between each focused beam waist and each target links should be ascertained, as well as the XY position relationship between the focused spots and the target links. Both of these relationships can be determined by scanning alignment targets on the wafer. This scanning process involves delivering either continuous wave or pulsed optical energy to the surface of the wafer and laterally scanning the XY stage such that the light reflects off alignment targets with known coordinates on the wafer. Monitoring the amount of energy reflected from the targets and the stage position sensors allows the position of the laser spots relative to the alignment targets to be determined with precision. These monitored signals also allow determination of the spot sized with the present Z height separation between the lens and the alignment structure. A system for doing so is illustrated in FIG. 31, in which a beam splitter 794 and a reflected light detector 798 are arranged to detect the reflected signal. A quarter-wave plate 796 may optionally be employed to produce circularly polarized light output to deliver to the work surface 740.

To focus in a multiple-spot system, a target is scanned at several focus heights and measurements of contrast or the spot size at these focus heights are used to predict and iteratively refine the focused beam waist. Because a multiple-spot system involving a single lens has only one lens-to-link structure or alignment target separation at a time, it may be necessary to pre-align all of the focused spots of a multi-spot system so that they all have substantially the same focus height. One method for doing so involves directing multiple laser beams onto targets at one or more focus depths, taking focus depth measurements for the various beams, determining relative focus depth differences based on those focus depth measurements, and adjusting the laser beam's paths in response, preferably to reduce the relative focus depth differences. That process can be repeated iteratively or by means of a feedback control system to achieve relative focusing pre-alignment. Thereafter, focus in a live wafer processing environment can be accomplished using just one of the focused laser spots. Focusing may be accomplished with a single target in a focus field, or with multiple targets, such as three or four targets, in a focus field. Focus height distances at the XY locations positions within the focus fields are then computed from the focus heights at the different focus target locations.

Focus in a multiple-spot system may also be enhanced by adding or moving a focus control optic 769 (FIG. 22) to offset one or more focused spot beam waists from other focused beam waists in the Z direction.

In addition to being a useful independent focus mechanism, the focus control optic 769 can impart a known Z focus offset of a focused beam waist relative to other spots to enhance the focus methodology. By scanning an alignment target with these two or more Z-offset spots, the Z direction that must be traveled to achieve focus is known. Three or more Z-offset spots can be used to predict not just the focus direction, but also the distance to focus.

Another focusing technique involves small range of travel focus adjustors on each lens and a single coarse Z adjustment that can be aligned to approximately one wafer thickness and locked in place. This is preferably implemented on a system with a substantially flat and level chuck so that the lenses do not have to be shifted up and down to correct for wafer tilt while processing link runs. This greatly reduces the amount of focusing work that must be done. Focus then only has to track small (generally less than about 10 μm) deviations that occur due to dust particles under the wafer or the chuck not being flat. Because each lens may focus upon a different part of the chuck, a piezoelectric actuator can be implemented on each lens to allow it to be moved vertically by a small amount to adjust focus. Focus can be adjusted by these piezo actuators so that the focused beam waist tracks the local wafer topology under each lens. Of course, alternative implementations of this focusing technique are possible such as using voice-coil or other actuators rather than piezoelectric actuators.

One alignment procedure for a multiple-spot system involves determining the position of all the spots relative to alignment targets and also any Z height dependency of this relationship. In the simplest implementation, an XY alignment target is first scanned and measured by all of the spots in the system to determine the XY and potentially Z offsets of these spots relative to one another. Then, the relative offsets may also be measured at different focus heights. This procedure may be performed on a single target, or many focus targets at different locations on the wafer, or on a calibration grid. The information gathered about the relative positioning of the spots at workpiece processing locations can be processed by one or more computers controlling the machine to calibrate and correct for differences in spot locations when processing different areas of the wafer.

Having characterized the multiple spots relative to one another, wafer XY alignment in different alignment fields can be implemented in a manner analogous to the single-spot system alignment. A target or targets can be scanned to determine the geometric relationship between a focused spot and the target link structures, and a known mapping between the spot locations can be applied to precisely determine the position of the rest of the system's focused spots. Then the XY beam steering mechanisms and focus offset mechanisms can be sent positioning commands to precisely position all of the focused laser spots at the desired locations for link runs and link run segments. This is preferably carried out by creating three-dimensional reference surfaces which define laser-to-workpiece calibrations in a region of the workpiece. Target link coordinates and the trajectory commands of stages, beam steering mechanisms, and focus offset mechanisms can be generated from CAD data of link blow locations, the reference surfaces, and any additional calibration information.

Some XY and focus calibration can be performed with only one of multiple spots on at a time. However there are other procedures where it is advantageous to scan targets with multiple spots that are simultaneously delivered. For example, scanning an XY alignment target using all of the spots at the same time can verify that all spots are focused and that the relative offsets between spots have been removed with the XY beam steering mechanisms through the calibration procedure. Reflection signals off of the scanned target would then appear to have the reflection signature of a single spot of tight focus. If any of the beams are not properly aligned or are out of focus, then multiple possibly overlapping reflection signatures will be observed, or the reflection signature of large spots superimposed with small spots may be observed.

Figure 32:
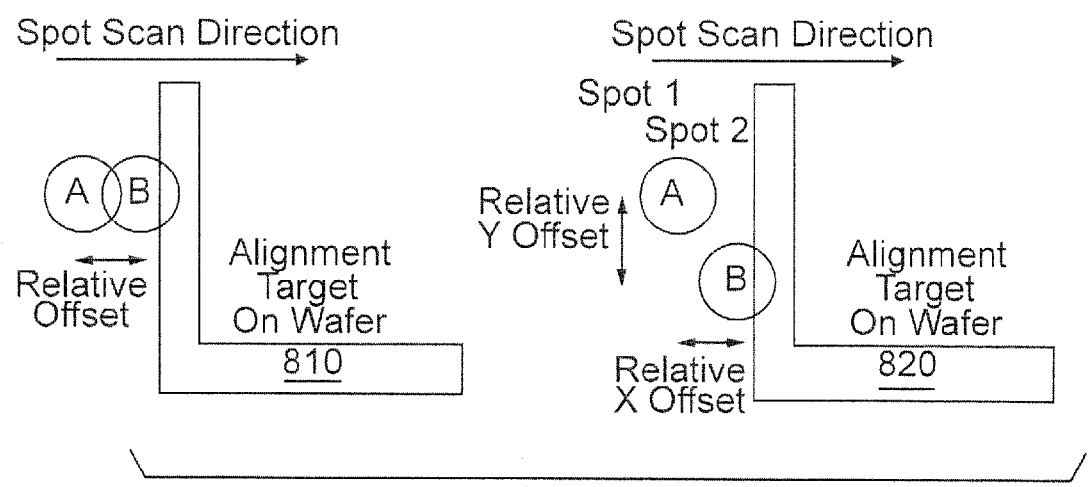
FIG. 32 is an illustration of a calibration target and two laser spots, according to one embodiment.

Another calibration procedure using multiple spots simultaneously delivered to the wafer uses an averaging technique to improve the quality of scan measurements. This technique is illustrated in FIG. 32. If the offset relationship between two spots is known and can be precisely set, then two (or more) spots can be set up to have a small lateral offset (e.g., a couple microns) along the axis that an alignment target 810 will be scanned. Then a single scan of the alignment target, collecting reflected sensor data and stage position data, can be used to determine the locations of the two spots. This information can be combined with the commanded spot offsets to determine the target location with enhanced accuracy by averaging the two spot locations. This technique can be used to refine the accuracy of the spots relative to one another in the scan direction. As an example, assume that the offset distance in the scan direction is 5 µm. Assume further that scanning of spot 1 over the alignment target 810 produces a maximum reflection intensity when the X position is 10,005.020 µm, and that scanning of spot 2 over the alignment target 810 produces a maximum reflection intensity when the X position is 10,000.000 µm. Then, after taking into account the known offset and then averaging the two position measurements, the resulting position would be 10,000.010 µm. Because that average is based on more data than a single measurement, it is a more reliable result.

In a system that can determine which reflections were caused by which incident focused spot it is possible to practice this averaging procedure with fully overlapping spots. Time slicing and exploiting different spot properties such as polarization or wavelength are some techniques by which a reflected spot can be associated with an incident spot. These techniques may be useful when the spots are partially overlapping or fully overlapping such that the relative offset is zero.

In the second case depicted in FIG. 32, the two scanned spots have both on-axis and cross-axis offset. That provides two estimates of the location of the alignment target 810 with measurements made at different points along the alignment target 820. These multiple measurements are useful for determining absolute positioning on the wafer even when the alignment target 820 is not uniform.

Next, since the beams of a multiple spot system may be equipped with XY beam steering mechanisms, these mechanisms, rather than the XY stage, may be used to scan the focused spots across alignment targets 810. Then the calibration routine correlates reflected signal energy off of alignment targets 810-820 with the sensed XY beam steering mechanism position and combines this with the XY stage position to determine spot positioning. Since independent XY beam steering mechanisms can be put in each of the beam paths, it is possible to independently scan XY alignment targets 810-820 with different focused spots. One target can be scanned in X while another alignment target 810-820 is scanned in Y with an appropriate method for determining which is the X signal and which is the Y signal. This can be done by dithering the power in the spots at specific frequencies using an AOM or other attenuator to change the energy, and then using the frequency information to determine which reflected signal comes from each spot. Alternatively, scanning the alignment targets 810-820 with spots moving at different velocities can be used to associate components of a reflection signal with a specific spot. Spots can be also be time-sliced or modulated at a high rate such that only one spot is on at time. Then reflection signals can be directly separated using time slices to allow scanning multiple targets, or an X and a Y target simultaneously. Separation based upon an optical property such as polarization or wavelength may also be appropriate for some implementations.

If multiple laser sources are used on a semiconductor link processing system, proper alignment will result in the highest quality link processing. One technique for alignment of multiple laser heads entails producing continuous wave or pulsed emissions from laser heads, measuring the propagation of beams relative to one another, and adjusting the beams to a desired overlap or relative position. Measuring the beams relative to one another may be done by scanning alignment targets 810-820 on wafers using the focused laser spots or it may involve placing PSDs or other optical detectors in the beam paths at different locations. An alternate technique is to place a PSD alignment tool into the beam path in place of the final focusing lens. Then beam positions can be measured while using the Z stage to change the position of the PSD, and optical elements, such as tilt plates and mirrors can be adjusted to correct beam positions. Measurement of beam or focused spot location may occur with all of the laser heads emitting individually or simultaneously.

One desirable beam alignment is such that the emissions from each laser head precisely overlap. Thus, the resulting single-beam system would have focused beam waists in the same position regardless of which laser head produced the pulse. Likewise, a two-beam system would produce two focused spots.

Another desirable beam alignment is to introduce an intentional on-axis and/or cross-axis relative offset of the focused spots produced by different laser heads. Such an offset may be implemented so that pulses from one laser head impinge upon one row of links while pulses from other laser heads impinge upon other rows of links.

The alignment of the laser beam paths may be adjusted during machine set-up and then not require further adjustment. However, there may be situations, such as to correct for thermal drift of focused spots, where dynamic or periodic beam adjustment is desirable. Actuators may be placed in the system for beam adjustment actuators and a control system can be put in place for configuring these actuators based upon scan data from alignment targets 810-820 or PSD measurements of beam position.

Actuators may also be used to reconfigure the alignment of beams produced by the different laser heads at times during wafer processing. For example it may be desirable to shift the positions of focused spots emanating from different laser heads between the processing of X and Y axis link runs, or between the processing of link run segments that require a different spacing. Furthermore, when processing with multiple spots through the same lens, it may be desirable to make small adjustments in the relative or absolute positions of the spots throughout a link run. For instance, there may be some dependency of focused spot XY position based upon Z height. If the beams are sloped, focusing at a different height due to a sloped chuck or changes in chuck and wafer topology may cause the spots to wander. Such errors can be corrected by using multiple beam actuators and/or beam steering mechanisms.

The methods and systems illustrated and described herein (e.g., the computation of a joint velocity profile) can exist in a variety of forms both active and inactive. For example, they can exist as one or more software programs comprised of program instructions in source code, object code, executable code or other formats. Any of the above formats can be embodied on a computer-readable medium, which include storage devices and signals, in compressed or uncompressed form. Exemplary computer-readable storage devices include conventional computer system RAM (random access memory), ROM (read only memory), EPROM (erasable, programmable ROM), EEPROM (electrically erasable, programmable ROM), flash memory and magnetic or optical disks or tapes. Exemplary computer-readable signals, whether modulated using a carrier or not, are signals that a computer system hosting or running a computer program can be configured to access, including signals downloaded through the Internet or other networks. Concrete examples of the foregoing include distribution of software on a CD ROM or via Internet download. In a sense, the Internet itself, as an abstract entity, is a computer-readable medium. The same is true of computer networks in general.

The terms and descriptions used above are set forth by way of illustration only and are not meant as limitations. Those skilled in the art will recognize that many variations can be made to the details of the above-described embodiments without departing from the underlying principles of the invention. For example, structures other than electrically conductive links on a semiconductor substrate can be processed with multiple laser spots. As another example, not all link processing is for the purpose of severing a link so it does not conduct; sometimes the purpose of the laser radiation is to make an otherwise non-conductive "link" conductive or to otherwise change a link's properties. The scope of the invention should therefore be determined only by the following claims—and their equivalents—in which all terms are to be understood in their broadest reasonable sense unless otherwise indicated.

The invention claimed is:

1. A method for processing a semiconductor substrate having a plurality of structures to be selectively irradiated with multiple laser beams, the structures being arranged in a plurality of substantially parallel rows extending in a generally lengthwise direction, the method comprising:

generating a first laser beam that propagates along a first laser beam axis that intersects a first target location on or within the semiconductor substrate;

generating a second laser beam that propagates along a second laser beam axis that intersects a second target location on or within the semiconductor substrate, the second target location being offset from the first target location in a direction perpendicular to the lengthwise direction of the rows by some amount such that, when the first target location is a structure on a first row of structures, the second target location is a structure or between two adjacent structures on a second row distinct from the first row; and moving the semiconductor substrate relative to the first and second laser axes in a direction approximately parallel to the rows of structures, so as to pass the first target location along the first row to irradiate for a first time selected structures in the first row, and so as to simultaneously pass the second target location along the second row to irradiate for a second time structures previously irradiated by the first laser beam during a previous pass of the first target location along the second row.

2. The method of claim 1, wherein the first and second laser beams are pulsed laser beams.

3. The method of claim 1, wherein the first and second laser beams have respective first and second sets of optical properties, and wherein the first and second sets are different from one another.

4. The method of claim 1, wherein the first laser beam axis is offset from the second laser beam axis by some amount in a direction parallel to the lengthwise direction of the rows.

5. The method of claim 1, wherein the steps of generating the laser beams comprise:

generating the first and second laser beams from two respective lasers.

6. The method of claim 1, wherein the steps of generating the laser beams comprise:

generating a single laser beam from a single laser; and
splitting the single laser beam to form the first and second laser beams.

7. The method of claim 1, wherein the steps of generating the laser beams are commenced based upon a trigger signal.

8. The method of claim 7, wherein the trigger signal is generated based upon a timing signal.

9. The method of claim 7, wherein the trigger signal is generated based upon a comparison of one or more desired target locations and the positions of one or more of the first and second laser beam axes.

10. The method of claim 1, further comprising:

selectively preventing the first laser beam from reaching the first target location; and
selectively preventing the second laser beam from reaching the second target location.

11. The method of claim 1, wherein the first and second laser beams reach the substrate at a substantially simultaneous time.

12. The method of claim 1, wherein the first and second laser beams reach the substrate at different times.

13. The method of claim 1, further comprising:
during the moving step, dynamically adjusting the relative spacing between the incident locations of the first and second laser beam axes on the semiconductor substrate.

14. The method of claim 13, wherein the adjustment of the relative spacing is in a direction substantially perpendicular to the lengthwise direction of the rows.

15. The method of claim 1, wherein the moving step comprises:
moving the first and second laser beam axes.

16. The method of claim 1, wherein the moving step comprises:
moving the semiconductor substrate.

17. The method of claim 1, wherein the structures are electrically conductive links and the irradiation of a link results in severing that link.

18. The method of claim 1, wherein the structures are potential electrically conductive links and the irradiation of a link results in making an electrical connection in that link.

19. The method of claim 1, wherein the semiconductor substrate comprises multiple dies, and the first laser beam axis is incident upon one die on the semiconductor substrate and the second laser beam axis is incident upon a separate die on the semiconductor substrate.

20. The method of claim 1, further comprising:
repeating the moving step so that the moving step is performed at least twice for each row having structures selected to be irradiated.

21. The method of claim 1, wherein the incident location of the second laser beam on a given structure is offset in the lengthwise direction of the structure from the incident location of the first laser beam on the given structure.

22. The method of claim 1, wherein the semiconductor substrate comprises a number of dice having a substantially equal dice spacing between corresponding parts of adjacent dice, wherein the first and second laser beam axes intersect the semiconductor substrate at respective first and second spots, and wherein the first and second spots are offset from one another by some amount in the lengthwise direction of the row, wherein said amount is equal to a non-zero integer multiple of said dice spacing.

23. The method of claim 1, further comprising:
adjusting a size of the first laser beam.

24. The method of claim 23, further comprising:
adjusting a size of the second laser beam.

25. The method of claim 1, further comprising:
propagating the first laser beam through a first lens that focuses the first laser beam on or within the semiconductor substrate; and
propagating the second laser beam through a second lens that focuses the second laser beam on or within the semiconductor substrate, wherein the second lens is different from the first lens.

26. The method of claim 25, wherein the first laser beam does not propagate through the second focus lens, and wherein the second laser beam does not propagate through the first focus lens.

27. The method of claim 1, further comprising:
generating a third laser beam that propagates along a third laser beam axis that intersects a third target location on or within the semiconductor substrate.

28. The method of claim 27, wherein the third target location is offset from at least one of the first target location and the second target location, the offset being in a direction perpendicular to the lengthwise direction of the rows by some amount such that, when either the first target location is a structure on a first row of structures or the second target location is a structure on a second row of structures, the third target location is a structure or between two adjacent structures on a third row distinct from both the first and second rows.

29. A method for processing a semiconductor substrate having a plurality of structures to be selectively irradiated with multiple laser beams, each structure having two ends and characterized by a length, width and depth, the length being measured in a lengthwise direction between the two ends, the width being measured in a widthwise direction transverse to the length, the depth being measured in a depthwise direction transverse to both the length and the width, the length being greater that both of the width and depth, at least some of the structures being arranged in a generally common orientation in parallel rows extending in the widthwise direction of the structures, wherein adjacent structures in the same row are spaced apart by a generally uniform pitch in the widthwise direction of the structures, the method comprising:

generating a first laser beam that propagates along a first laser beam axis that intersects a first target location on or within the semiconductor substrate;

generating a second laser beam that propagates along a second laser beam axis that intersects a second target location on or within the semiconductor substrate, the second target location being offset from the first target location in the lengthwise direction by some amount such that, when the first target location is a structure on a first row of structures, the second target location is a structure or between two adjacent structures on a second row distinct from the first row; and moving the semiconductor substrate relative to the first and second laser axes in the widthwise direction, so as to pass the first target location along the first row to irradiate for a first time selected structures in the first row, and so as to simultaneously pass the second target location along the second row to irradiate for a second time structures previously irradiated by the first laser beam during a previous pass of the first target location along the second row.

30. A method for processing a semiconductor substrate having a plurality of structures to be selectively irradiated with multiple laser beams, the structures being arranged in a plurality of substantially parallel rows extending in a generally lengthwise direction, the method comprising:

generating first and second laser beams that propagates along respective first and second laser beam axes that intersect the semiconductor substrate at respective first and second beam spots;

offsetting the first and second laser beam axes from one another in a direction perpendicular to the lengthwise direction of the rows by some amount such that the first and second laser beam spots fall on distinct rows of structures;

passing the first and second beam spots in unison across a given row and another row distinct from said given row, respectively, while the first laser provides first laser irradiation to selected structures in said given row; and passing the second and first beam spots in unison across said given row and another row distinct from the given row, respectively, while the second laser provides second laser irradiation to said selected structures in said given row, whereby said selected structures in said given row receive first laser irradiation form the first laser during the first passing step and later receive second laser irradiation from the second laser during the second passing step.

31. A method according to claim 30, further comprising the following step performed between the first and second passing steps:

moving the semiconductor substrate relative to the first and second laser beam axes in a direction perpendicular to the generally lengthwise direction and in an amount such that the when the second beam spot is on a structure in said given row, the second beam spot is on a structure or between two adjacent structures on another row distinct from the given row.

32. A method according to claim 31, wherein said amount is greater than about 8 μm.

* * * * *